(12) United States Patent
Huang et al.

(10) Patent No.: US 11,653,501 B2
(45) Date of Patent: May 16, 2023

(54) FERROELECTRIC MEMORY DEVICE, MANUFACTURING METHOD OF THE FERROELECTRIC MEMORY DEVICE AND SEMICONDUCTOR CHIP

(71) Applicant: Taiwan Semiconductor Manufacturing Company, Ltd., Hsinchu (TW)

(72) Inventors: Rainer Yen-Chieh Huang, Changhua County (TW); Hai-Ching Chen, Hsinchu (TW); Yu-Ming Lin, Hsinchu (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 33 days.

(21) Appl. No.: 17/352,339

(22) Filed: Jun. 20, 2021

(65) Prior Publication Data

US 2022/0285396 A1 Sep. 8, 2022

Related U.S. Application Data

(60) Provisional application No. 63/156,958, filed on Mar. 5, 2021.

(51) Int. Cl.
*H01L 27/11597* (2017.01)
*H01L 29/78* (2006.01)
(Continued)

(52) U.S. Cl.
CPC .... *H01L 27/11597* (2013.01); *H01L 23/5283* (2013.01); *H01L 27/1159* (2013.01);
(Continued)

(58) Field of Classification Search
CPC ......... H01L 27/11553; H01L 27/11585; H01L 27/1159; H01L 27/11597; H01L 29/40111; H01L 29/516; H01L 29/517; H01L 29/518
See application file for complete search history.

(56) References Cited

U.S. PATENT DOCUMENTS

2018/0286920 A1* 10/2018 Wicklein ............ H01L 27/2481
2019/0311756 A1* 10/2019 Sharma .................... G11C 11/22
(Continued)

FOREIGN PATENT DOCUMENTS

| CN | 114981967 A | * | 8/2022 | ........ H01L 27/11556 |
| KR | 20220109026 A | * | 8/2022 | .......... H01L 27/1159 |
| WO | WO-2018136734 A1 | * | 7/2018 | .......... H01L 27/1159 |

*Primary Examiner* — Matthew E Warren
(74) *Attorney, Agent, or Firm* — JCIPRNET

(57) ABSTRACT

A ferroelectric memory device, a manufacturing method of the ferroelectric memory device and a semiconductor chip are provided. The ferroelectric memory device includes a gate electrode, a ferroelectric layer, a channel layer, first and second blocking layers, and source/drain electrodes. The ferroelectric layer is disposed at a side of the gate electrode. The channel layer is capacitively coupled to the gate electrode through the ferroelectric layer. The first and second blocking layers are disposed between the ferroelectric layer and the channel layer. The second blocking layer is disposed between the first blocking layer and the channel layer. The first and second blocking layers comprise a same material, and the second blocking layer is further incorporated with nitrogen. The source/drain electrodes are disposed at opposite sides of the gate electrode, and electrically connected to the channel layer.

20 Claims, 30 Drawing Sheets

(51) Int. Cl.
*H01L 23/528* (2006.01)
*H01L 27/1159* (2017.01)
*H01L 27/11553* (2017.01)
*H01L 29/51* (2006.01)
*H01L 21/28* (2006.01)

(52) U.S. Cl.
CPC .. *H01L 27/11553* (2013.01); *H01L 29/40111* (2019.08); *H01L 29/516* (2013.01); *H01L 29/517* (2013.01); *H01L 29/518* (2013.01); *H01L 29/78391* (2014.09)

(56) References Cited

U.S. PATENT DOCUMENTS

| | | | |
|---|---|---|---|
| 2022/0093151 A1* | 3/2022 | Suzuki | G11C 11/2255 |
| 2022/0173251 A1* | 6/2022 | Samachisa | H01L 27/11597 |
| 2022/0229588 A1* | 7/2022 | Dutta | G11C 11/5642 |

* cited by examiner

FERROELECTRIC MEMORY DEVICE, MANUFACTURING METHOD OF THE FERROELECTRIC MEMORY DEVICE AND SEMICONDUCTOR CHIP

CROSS-REFERENCE TO RELATED APPLICATION

This application claims the priority benefit of U.S. provisional application Ser. No. 63/156,958, filed on Mar. 5, 2021. The entirety of the above-mentioned patent application is hereby incorporated by reference herein and made a part of this specification.

BACKGROUND

Non-volatile memory device, in contrast to volatile memory device, can retain stored data even after removal of power supply. Ferroelectric memory device is a type of the non-volatile memory device, and includes a ferroelectric material for storing permanent dipole moment. Further, polarity of such dipole moment stored in the ferroelectric material can be switched by adjusting an applied electrical field. Accordingly, binary data "1", "0" can be stored as polarizations with different polarities.

Ferroelectric field effect transistor (FET) is a type of the ferroelectric memory device that resembles a typical FET, except that a ferroelectric material is sandwiched between a gate terminal and a channel region. The polarizations with different polarities stored in the ferroelectric material may affect a threshold voltage of the ferroelectric FET, and can be non-destructively read out by sensing a channel resistance of the ferroelectric FET. However, interface defined between the ferroelectric material and the channel region as well as interface defined between the ferroelectric material and the gate terminal of the ferroelectric FET are rather susceptible for defect formation. Performance of the ferroelectric FET may be accordingly influenced by these defects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
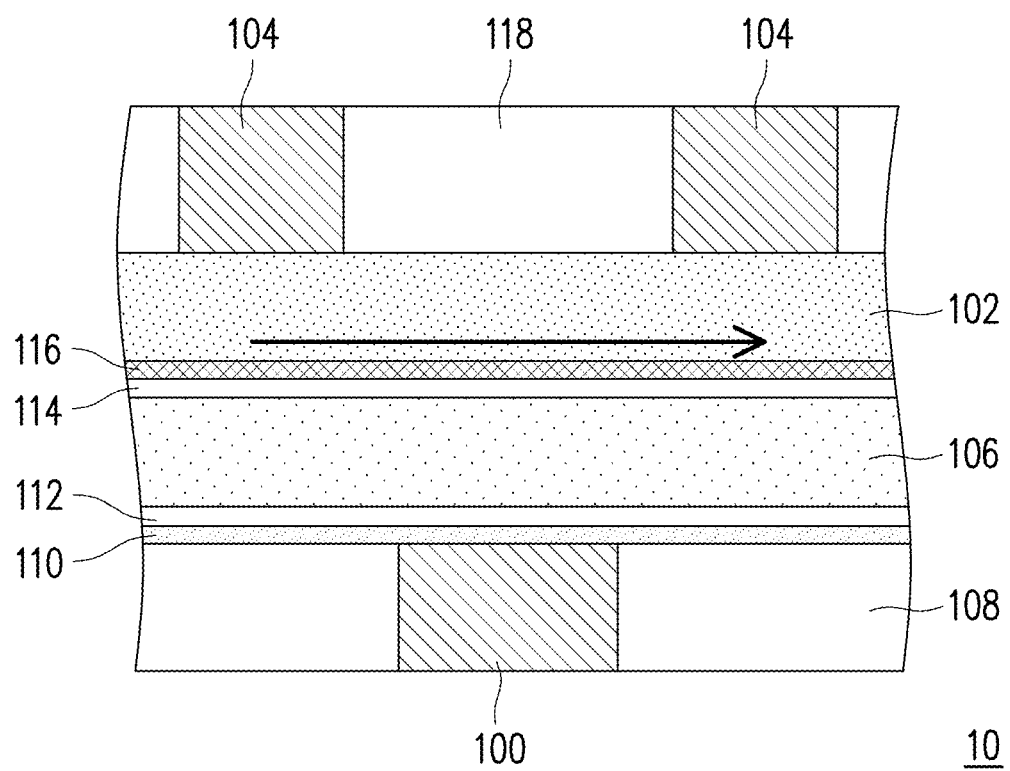
FIG. 1A is a cross-sectional view schematically illustrating a ferroelectric memory device according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a cross-sectional view schematically illustrating a ferroelectric memory device 10 according to some embodiments of the present disclosure.

Referring to FIG. 1A, the ferroelectric memory device 10 is a ferroelectric FET with a bottom gate configuration. A gate electrode 100 lies below a channel layer 102, and a pair of source/drain electrodes 104 may be separately in contact with the channel layer 102 from above the channel layer 102. Further, a ferroelectric layer 106 is sandwiched between the gate electrode 100 and the overlying channel layer 102. The ferroelectric layer 106 can store binary data as polarizations with different polarities by adjusting an electric field across the ferroelectric layer 106, and alter a threshold voltage as well as a channel resistance of the ferroelectric memory device 10. By sensing the channel resistance, the binary data stored in the ferroelectric memory device 10 can be read out.

In some embodiments, the ferroelectric memory device 10 is embedded in a back-end-of-line (BEOL) structure of a device die. Although not shown, a front-end-of-line (FEOL) structure including active devices (e.g., metal-oxide-semiconductor (MOS) FETs) formed on a semiconductor substrate (e.g., a semiconductor wafer) lies below the BEOL structure, and some conductive features in the BEOL structure interconnect the underlying active devices, to form an integrated circuit. In these embodiments, as a planar type ferroelectric FET, the gate electrode 100 may be formed in one of a stack of dielectric layers (labeled as a dielectric layer 108) in the BEOL structure. The conductive features for interconnecting the underlying active devices may be formed elsewhere in the stack of the dielectric layers. The gate electrode 100 is formed of a conductive material. For instance, the conductive material may include Cu, Pt, Au, Ti, TiN, TiC, Ta, TaN, W, $WN_x$, $WSi_x$, Fe, Ni, Be, Cr, Co, Sb, Ir, Nb, Mo, Os, Th, V, Ru, $RuO_x$ or combinations thereof. In some embodiments, a thickness of the gate electrode 100 ranges from about 15 nm to about 500 nm.

The ferroelectric layer 106 lies over the dielectric layer 108 and the gate electrode 100. In some embodiments, the ferroelectric layer 106 globally covers the dielectric layer 108, and is overlapped with the gate electrode 100. The ferroelectric layer 106 is formed of a ferroelectric material. As an example, the ferroelectric material may include hafnium zirconium oxide (HfZrO or HZO). The HfZrO can be presented as $Hf_xZr_{(1-x)}O_y$, where the "x" may be between 0 and 1, and the "y" may be between 1.5 and 2. Further, the HfZrO may be doped with elements with smaller ion radius or elements with larger ion radius, in order to enhance ferroelectric polarization. The elements with smaller ion radius may include Al or Si, while the elements with larger ion radius may include La, Sc, Ca, Ba, Gd, Y, Sr or the like. Moreover, oxygen vacancies may be formed in the HfZrO. As another example, the ferroelectric material may include aluminum nitride (AlN) doped Sc (AlN:Sc). In some embodiments, a thickness of the ferroelectric layer 106 ranges from 0.1 nm to 100 nm.

In some embodiments, a buffer layer 110 and a seed layer 112 are sandwiched between the ferroelectric layer 106 and the underlying dielectric layer 108 and the gate electrode 100. The buffer layer 110 may lie on the dielectric layer 108 and the gate electrode 100. A material of the buffer layer 110 may be selected to reduce a lattice mismatch at an interface defined between the ferroelectric layer 106 and the gate electrode 100. For instance, the buffer layer 110 may be formed of hafnium oxide, zirconium oxide, titanium oxide, tungsten oxide or combinations thereof. In addition, a thickness of the buffer layer 110 may range from 1 Å to 20 Å, and the buffer layer 110 may be amorphous or crystallized. On the other hand, the seed layer 112 may be formed on the buffer layer 110, and in contact with the ferroelectric layer 106 from below the ferroelectric layer 106. The seed layer 112 is formed by a selected material with a preferred crystalline phase, to promote an orthorhombic phase (O-phase) of the ferroelectric layer 106, and to inhibit a monoclinic phase (M-phase) of the ferroelectric layer 106. The increased O-phase of the ferroelectric layer 106 may result in a higher ferroelectric polarization. In those embodiments where the ferroelectric layer 106 is formed of HfZrO, the seed layer 112 may be formed of zirconium oxide (e.g., $ZrO_2$), and may be crystallized to the O-phase or a tetragonal phase (T-phase), to increase an O-phase fraction of the ferroelectric layer 106. The O-phase, the T-phase, a cubic phase (C-phase) and the M-phase may coexist in the ferroelectric layer 106 formed of HfZrO. By using the seed layer 112 with a preferred crystalline phase (e.g., the O-phase or the T-phase) as a growth template of the ferroelectric layer 106, a total phase fraction of the O-phase, the T-phase and the C-phase (represented by "(O+T+C)") in the ferroelectric layer 106 may be increased. For instance, the (O+T+C) in the ferroelectric layer 106 may be greater than 50% of the M-phase fraction in the ferroelectric layer 106. As another indicator, a ratio of the (O+T+C) over a total phase fraction of the O-phase, the T-phase, the C-phase and the M-phase (represented by "(O+T+C+M)") may be increased by using the seed layer 112 with the preferred crystalline phase as the growth template of the ferroelectric layer 106. Other available materials for the seed layer 112 as the growth template of the HfZrO ferroelectric layer 106 may include yttrium oxide (e.g., $Y_2O_3$), zirconium yttrium oxide (ZYO), aluminum oxide (e.g., $Al_2O_3$), tantalum oxide (e.g., $Ta_2O_5$), hafnium zirconium oxide (e.g., $Hf_xZr_{1-x}O$, where the "x" from 1 to 2) and hafnium oxide (e.g., $HfO_x$, where the "x" from 1 to 2). In alternative embodiments where the ferroelectric layer 106 is formed of AlN:Sc, the seed layer 112 may be formed of aluminum nitride (AlN). Further, each of these material alternatives for the seed layer 112 may be crystallized to the C-phase, the T-phase, the O-phase or combinations thereof. In addition, the seed layer 112 may be a single layer, or a multilayer structure including one or more of the available material alternatives described above. In some embodiments, a thickness of the seed layer 112 ranged from 0.1 nm to 5 nm.

The channel layer 102 lies over the ferroelectric layer 106, and may be formed of a semiconductor material. The semiconductor material may be an oxide semiconductor material, a group IV semiconductor material or a group III-V semiconductor material. For instance, the oxide semiconductor material may include indium-gallium-zinc-oxide (IGZO), tin oxide ($SnO_x$), indium oxide ($InO_x$), gallium oxide (e.g., $Ga_2O_3$), zinc oxide (e.g., ZnO), magnesium oxide (e.g., MgO), gadolinium oxide (e.g., GdO) or in any binary-, ternary-, quaternary-combinations. Indium-zinc-oxide (InZnO) may be one of the binary combination examples. Tin-gallium-zinc-oxide (SnGaZnO) and tin-indium-zinc-oxide (SnInZnO) may be two of the ternary combination examples, and tin-indium-gallium-zinc-oxide (SnInGaZnO) may be one of the quaternary combination examples. On the other hand, the group IV semiconductor material may include Si and/or SiGe, and the group III-V semiconductor material may include GaN, GaAs or InGaAs. In some embodiments, the channel layer 102 is formed of amorphous IGZO, with a thickness ranging from 0.1 nm to 100 nm.

In some embodiments, a blocking layer 114 and a blocking layer 116 lie between the ferroelectric layer 106 and the overlying channel layer 102. The blocking layer 114 may be in contact with the overlying ferroelectric layer 106, while the blocking layer 116 may be in contact with the underlying channel layer 102. The blocking layers 114, 116 may include a material selected to enhance conduction band offset ($V_{CBO}$) and valence band offset ($V_{VBO}$) with respect to conduction and valence bands of the channel layer 102, in order to increase a potential barrier between the ferroelectric layer 106 and the channel layer 102. Accordingly, leakage current entering the ferroelectric layer 106 from the channel layer 102 can be reduced by disposing the blocking layers 114, 116. In some embodiments, the blocking layers 114, 116 both include an oxide ferroelectric material. For instance, the oxide ferroelectric material may include hafnium oxide ($HfO_x$) or zirconium oxide ($ZrO_x$), and may be doped with materials with higher bandgap (i.e., higher than bandgap of the semiconductor material for forming the channel layer 102). These materials incorporated in the oxide ferroelectric material may include silicon oxide (e.g., $SiO_2$), yttrium oxide (e.g., $Y_2O_3$), magnesium oxide (e.g., MgO), aluminum oxide (e.g., $Al_2O_3$), silicon nitride (e.g., $Si_3N_4$), lanthanum oxide (e.g., $La_2O_3$), strontium oxide (e.g., SrO), gadolinium oxide (e.g., GdO), calcium oxide (e.g., CaO), scandium oxide (e.g., $Sc_2O_3$), zirconium-silicon-oxide (e.g., $ZrSiO_4$), hafnium-silicon-oxide (e.g., $HfSiO_4$), combinations thereof or other candidates having bandgap greater than the bandgap of the channel layer 102. For instance, in those embodiments where the channel layer 102 is formed of amorphous IGZO, the blocking layers 114, 116 may include $Hf_xSi_{1-x}O_y$, (where the "x" is 0.25, and the "y" is from 2 to 4), and the $V_{CBO}$ may be about 3.57 eV, and the $V_{VBO}$ may be about 0.67 eV. In alternative embodiments, the blocking layers 114, 116 may be respectively formed of a non-ferroelectric material, such as a dielectric material.

Moreover, the blocking layer 116 is further configured to reduce density of trap states close to an interface defined between the channel layer 102 and the ferroelectric layer 106 (or referred as density of interface traps ($D_{it}$)). A conduction channel, which is indicated by an arrow along a bottom surface of the channel layer 102 shown in FIG. 1A, is established close to such interface when the ferroelectric FET (i.e., the ferroelectric memory device 10) is turned on. The trap states at such interface may scatter carriers traveling along the conduction channel, and may result in higher subthreshold swing, lower on-current, lower field effect mobility and lower ratio of on-current over off-current ($I_{on}/I_{off}$) of the ferroelectric FET. Further, negative bias temperature instability (NBTI) and positive bias temperature instability (PBTI) of the ferroelectric FET may be degraded as well. In those embodiments where the blocking layers 114, 116 and the channel layer 102 are formed of oxide materials, oxygen vacancies may inevitably form in these oxide materials. Dangling bonds of the oxygen vacancies at the interface defined between the channel layer 102 and the ferroelectric layer 106 may contribute to the interfacial trap states that scatter carriers. Sources other than oxygen vacancies for forming the interfacial trap states are also possible, the present disclosure is not limited thereto. These interfacial trap states have to be passivated, in order to reduce the $D_{it}$. In those embodiments where the blocking layers 114, 116 include the same oxide material, the blocking layer 116 may be further incorporated with nitrogen. The nitrogen added to the blocking layer 116 may passivate the interfacial trap states, such that the $D_{it}$ can be lowered. In some embodiments, the blocking layers 114, 116 are formed of the same oxide ferroelectric material, except that the blocking layer 116 is further nitrided. For instance, the blocking layer 114 may be hafnium oxide ($HfO_x$), while the blocking layer 114 may be nitrogen-doped hafnium oxide ($N:HfO_x$). However, other available materials described above can be used for the blocking layer 114, and the selected material may be incorporated with nitrogen for forming the blocking layer 116. In some embodiments, a thickness of the blocking layer 114 ranges from 0.1 nm to 5 nm, while a thickness of the blocking layer 116 ranges from 0.1 nm to 5 nm.

The source/drain electrodes 104 may be disposed on a side of the channel layer 102 facing away from the blocking layer 116. As shown in FIG. 1A, the channel layer 102 may lie on the blocking layer 116, and the source/drain electrodes 104 are disposed on the channel layer 102. In some embodiments, the source/drain electrodes 104 are laterally surrounded by a dielectric layer 118. The source/drain electrodes 104 are formed of a conductive material. For instance, the conductive material may include Cu, Pt, Au, Ti, TiN, TiC, Ta, TaN, W, $WN_x$, $WSi_x$, Fe, Ni, Be, Cr, Co, Sb, Ir, Nb, Mo, Os, Th, V, Ru, $RuO_x$ or combinations thereof. In some embodiments, a thickness of the source/drain electrodes 104 ranges from about 15 nm to about 500 nm.

Figure 1B:
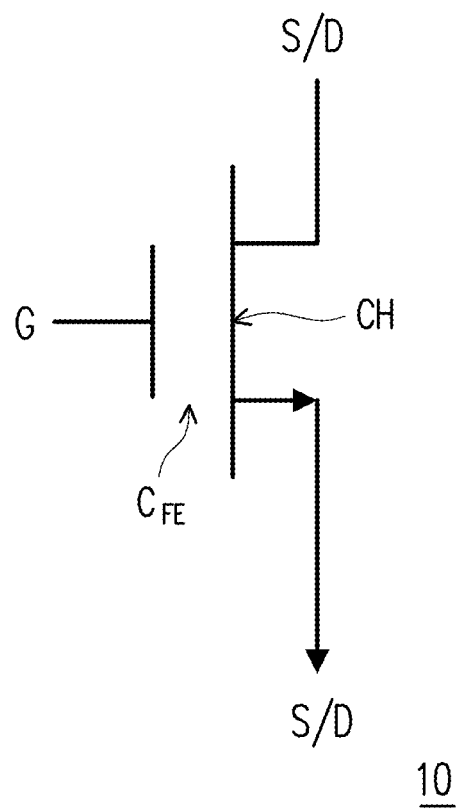
FIG. 1B is a circuit diagram of the ferroelectric memory device as shown in FIG. 1A.

FIG. 1B is a circuit diagram of the ferroelectric memory device 10 as shown in FIG. 1A.

Referring to FIG. 1A and FIG. 1B, the ferroelectric memory device 10 may be a ferroelectric FET. The gate electrode 100 may be functioned as a gate terminal G of the ferroelectric FET, and the source/drain electrodes 104 may be functioned as source/drain terminals S/D of the ferroelectric FET. A conduction channel CH extending between the source/drain terminals S/D may be established when the ferroelectric FET is turned on, and may be cut off or absent when the ferroelectric FET is in an off state. As described with reference to FIG. 1A, the conduction channel CH may be established in the channel layer 102. The gate terminal G is capacitively coupled to the conduction channel CH through a gate capacitor $C_{FE}$, and configured to control formation of the conduction channel CH. The gate capacitor $C_{FE}$ is formed across layers including the ferroelectric layer 106, thus may be referred as a ferroelectric capacitor $C_{FE}$.

Although not shown, the ferroelectric memory device 10 may be a single memory cell in a memory array. In some embodiments, the memory array is a two-dimensional memory that includes columns and rows of the ferroelectric memory devices 10 deployed at a single horizontal level. In alternative embodiments, the memory array is a three-dimensional memory that includes stacks of the ferroelectric memory devices 10. In these alternative embodiments, the ferroelectric memory devices 10 in each stack are arranged along a vertical direction.

Figure 2A:
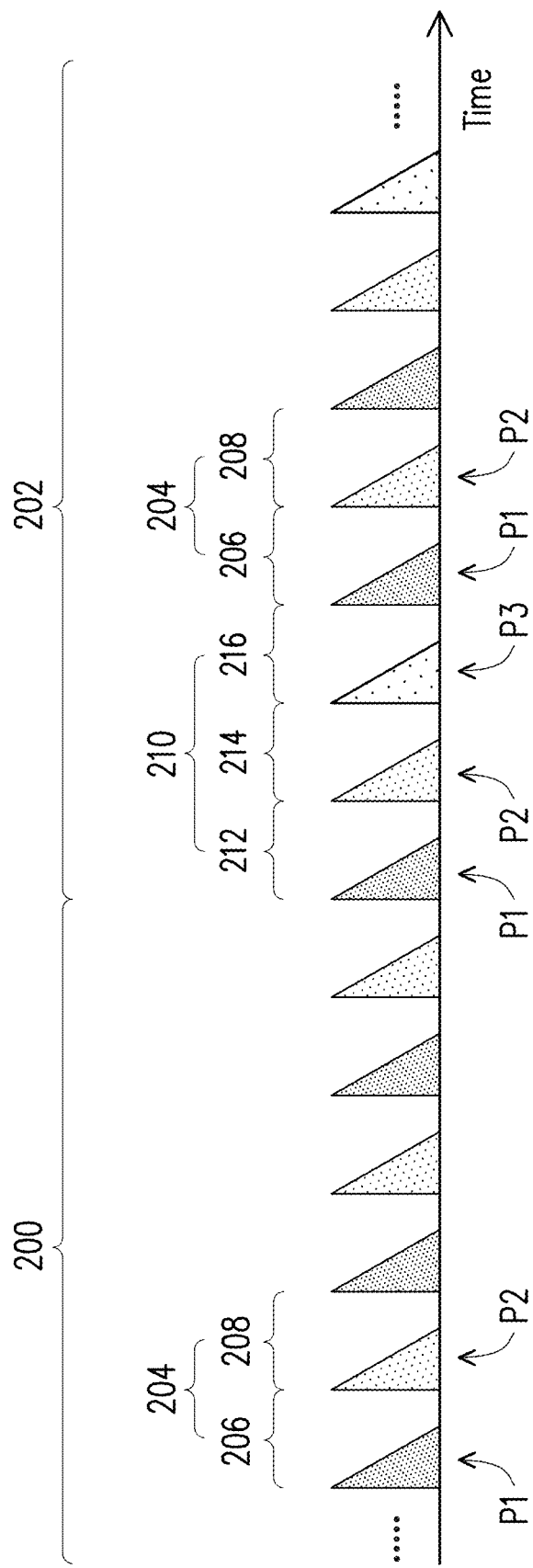
FIG. 2A is a schematic pulse diagram illustrating a method for forming the blocking layers in the ferroelectric memory device shown in FIG. 1A, according to some embodiments of the present disclosure.

FIG. 2A is a schematic pulse diagram illustrating a method for forming the blocking layers 114, 116, according to some embodiments of the present disclosure.

Referring to FIG. 1A and FIG. 2A, in some embodiments, a method for forming the blocking layers 114, 116 includes a single deposition process. In these embodiments, the deposition process may be an atomic layer deposition (ALD) process. The ALD process may have a first half 200 corresponding to formation of the blocking layer 114, and have a second half 202 corresponding to formation of the blocking layer 116. During the first half 200 of the ALD process, multiple deposition cycles 204 are performed. Each deposition cycle 204 may include a first half-cycle 206 and a second half-cycle 208. A precursor pulse P1 is provided during the first half-cycle 206, and a precursor pulse P2 is provided during the second half-cycle 208. A precursor used for the precursor pulse P1 may be different from the precursor used for the precursor pulse P2. In those embodiments where the blocking layer 114 is formed of hafnium oxide ($HfO_x$), the precursor used for the precursor pulse P1 may be hafnium-containing precursor, while the precursor used for the precursor pulse P2 may be oxygen-containing precursor. For instance, the hafnium-containing precursor may include hafnium tetrachloride, bis(trimethylsilyl)amidohafnium(IV) chloride, dimethylbis(cyclopentadienyl)hafnium(IV), hafnium(IV) tert-butoxide, hafnium isopropoxide isopropanol, tetrakis(diethylamido)hafnium(IV), tetrakis(dimethylamido)hafnium(IV), tetrakis(ethylmethylamido)hafnium(IV), the like or combinations thereof. In addition, as examples, the oxygen-containing precursor may include dihydrogen monoxide (water), diatomic oxygen ($O_2$) or ozone ($O_3$). However, as described above, the materials of the blocking layers 114, 116 are not limited to the hafnium oxide and nitrogen-doped hafnium oxide. In some embodiments, each of the first and second precursor pulses P1, P2 is followed by a purge step, such that the first and second precursor pulses P1, P2 may be separated from one another by a non-zero time interval. In addition, the deposition cycle 204 may be repeated until an expected thickness of the blocking layer 114 is achieved.

On the other hand, the deposition cycles 204 and additional deposition cycles 210 may be alternately performed during the second half 202 of the ALD process. The deposition cycles 210 are similar to the deposition cycles 204, except that the deposition cycles 210 further include precursor pulses that provide elements to the blocking layer 116 for passivating the interfacial trap states (i.e., the precursor pulses P3 to be described). In some embodiments, each deposition cycle 210 includes a first section 212, a second section 214 and a third section 216. In some embodiments, the first section 212 of the deposition cycle 210 is identical with the first half-cycle 206 of the deposition cycle 204, and the precursor pulse P1 is also provided during the first section 212 of the deposition cycle 210. In addition, the second section 214 of the deposition cycle 210 may be identical with the second half-cycle 208 of the deposition cycle 204, and the precursor pulse P2 is also provided during the second section 214 of the deposition cycle 210. Further, during the third section 216 of the deposition cycle 210, a precursor pulse P3 is provided for incorporating elements into the blocking layer 116 for passivating the interfacial trap states as described with reference to FIG. 1A. In those embodiments where the interfacial trap states came from oxygen vacancies, the precursor pulse P3 may be provided for incorporating nitrogen into the blocking layer 116 to passivate the dangling bonds at the oxygen vacancies, and a nitrogen-containing precursor is used for the precursor pulse P3. For instance, the nitrogen-containing precursor may include diatomic nitrogen ($N_2$), ammonia ($NH_3$), allylamine, azoisobutane, diallylamine, 1,1-dimethylhydrazine, d2-1,1-dimethylhydrazine, ethylazide, d5-ethylazide, methylhydrazine, d3-methylhydrazine, tertiarybutylamine, triallylamine, hydrazine or the like. In some embodiments, as shown in FIG. 2A, the first section 212 is followed by the second section 214, and the second section 214 precedes the third section 216. However, in alternative embodiments, a sequential order of the second and third sections 214, 216 is reversed, and the first section 212, the third section 216 and the second section 214 are sequentially performed. As similar to the first and second sections 212, 214 of the deposition cycle 210 (or the first and second half-cycles 206, 208 of the deposition cycle 204), the third section 216 of the deposition cycle 210 may include a purge step after the precursor pulse P3 is provided. The deposition cycles 204, 210 may be alternately performed until an expected thickness of the blocking layer 116 is achieved.

In those embodiments where the deposition cycles 204, 210 are alternately performed in the second half 202 of the ALD process, the as-deposited blocking layer 116 may have non-uniform concentration profile of the elements for passivating the interfacial trap states (e.g., nitrogen) along a thickness direction of the as-deposited blocking layer 116. A post deposition annealing process may be performed on the as-deposited blocking layers 114, 116, and the concentration profile of the elements for passivating the interfacial trap states (e.g., nitrogen) may become substantially uniform along the thickness direction. In some embodiments, a process temperature of the post deposition annealing process ranges from 250° C. to 800° C., and a process time of the post deposition annealing process ranges from 1 second to 5 hours. In addition, the post deposition annealing process may be performed in $N_2$ ambient.

Figure 2B:
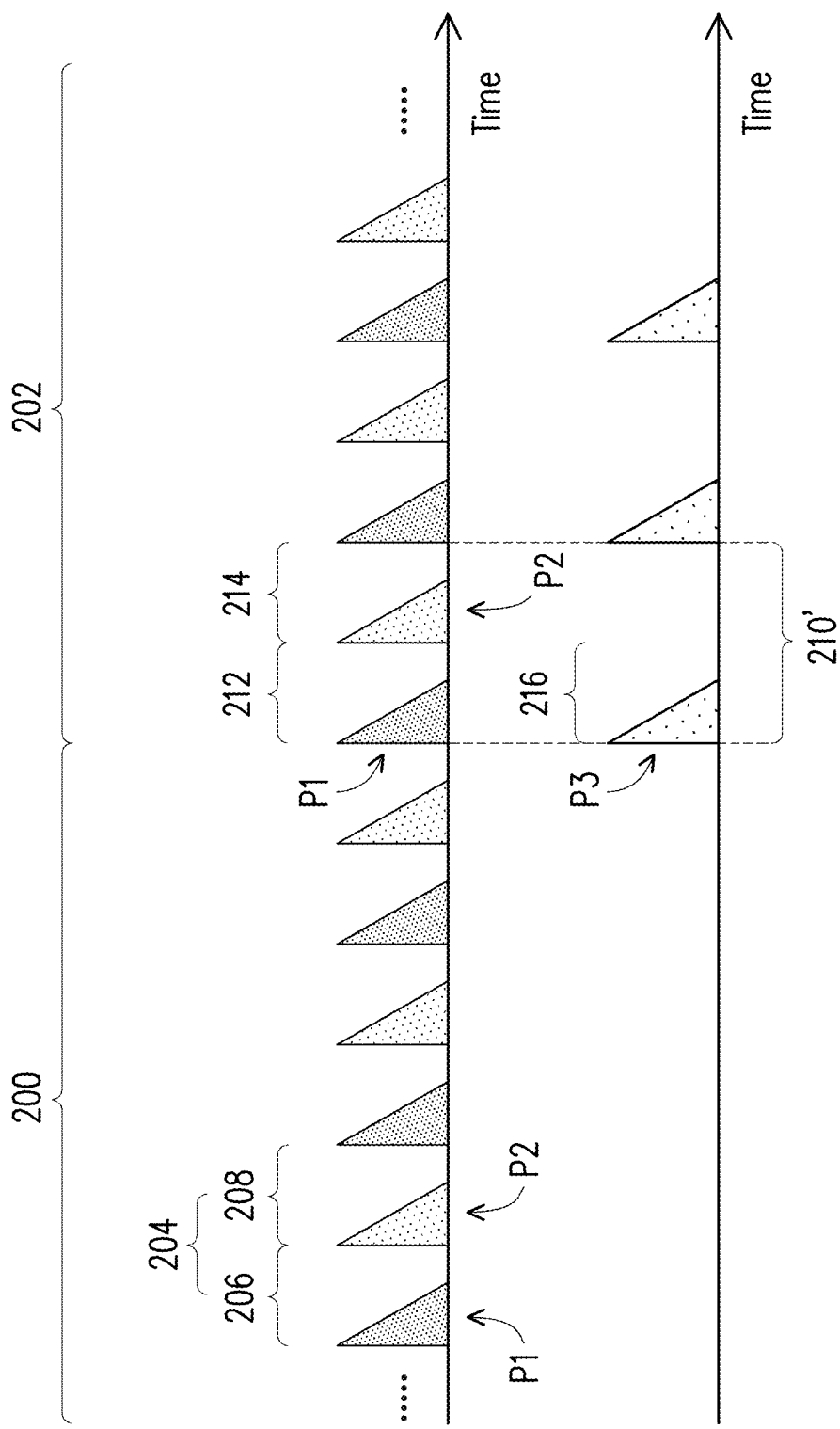
FIG. 2B is a schematic pulse diagram illustrating a method for forming the blocking layers in the ferroelectric memory device shown in FIG. 1A, according to some embodiments of the present disclosure.

FIG. 2B is a schematic pulse diagram illustrating a method for forming the blocking layers 114, 116, according to some embodiments of the present disclosure. An ALD process to be described with reference to FIG. 2B is similar to the ALD process described with reference to FIG. 2A, thus only difference between these ALD processes will be discussed. The like or the same parts in these ALD processes may not be repeated again.

Referring to FIG. 2B, in the second half 202 of the ALD process, multiple deposition cycles 210' are consecutively performed. The deposition cycle 210' is similar to the deposition cycle 210 as described with reference to FIG. 2A, except that the third section 216 of the deposition cycle 210' is overlapped with the first section 212 in the same deposition cycle 210', which is followed by the second section 214 in the same deposition cycle 210'. As such, during each deposition cycle 210', time periods at which the precursor pulses P1, P3 are provided to an ALD process chamber overlap, and the precursor pulse P2 is provided after the precursor pulses P1, P3. In some embodiments, the precursor pulses P1, P3 in the same deposition cycle 210' are entirely overlapped with each other. Since the deposition cycles 210' are consecutively performed without the deposition cycles 204 inserted between the deposition cycles 210', the concentration profile of the elements for passivating the interfacial trap states (e.g., nitrogen) of the as-deposited blocking layer 116 can be more uniform along the thickness direction. Nevertheless, the post deposition annealing process as described with reference to FIG. 2A may still be performed on the as-deposited blocking layers 114, 116.

Figure 3:
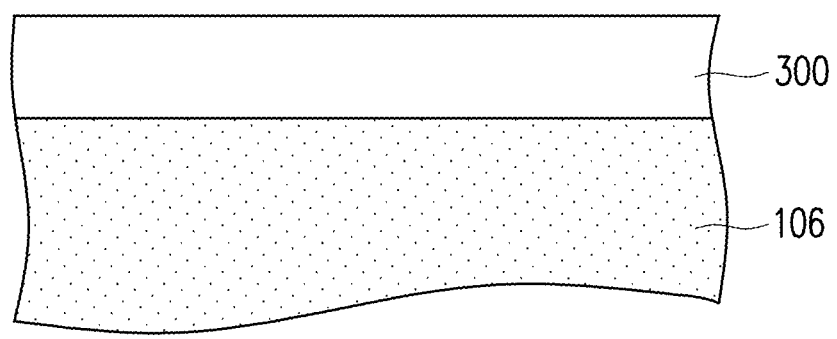
FIG. 3 is an enlarged cross-sectional view schematically illustrating an initial blocking layer for forming the blocking layers in the ferroelectric memory device shown in FIG. 1A, according to some embodiments of the present disclosure.

FIG. 3 is an enlarged cross-sectional view schematically illustrating an initial blocking layer 300 for forming the blocking layers 114, 116 as described with reference to FIG. 1A, according to some embodiments of the present disclosure.

Referring to FIG. 3, according to some embodiments, an initial blocking layer 300 is formed on the ferroelectric layer 106, and a portion of the initial blocking layer 300 away from the ferroelectric layer 106 is turned into the blocking layer 116, while the rest portion of the initial blocking layer 300 forms the blocking layer 114. In those embodiments where the blocking layer 114, 116 include the same oxide material except that the blocking layer 116 is further nitrided, a method for turning the portion of the initial blocking layer 300 into the blocking layer 116 includes performing an annealing process in nitrogen-containing ambient. During such annealing process, nitrogen in the ambient may react with a surface region of the initial blocking layer 300, and the oxide material in such surface region of the initial blocking layer 300 may be nitrided, to form the blocking layer 116. The nitrogen-containing ambient may include diatomic nitrogen ($N_2$), ammonia ($NH_3$), forming gas ($N_2/H_2$), $N_2O$, $N_2O_2$ or the like. In some embodiments, such annealing process is a rapid thermal annealing (RTA) process. In these embodiments, a process time of the annealing process may range from 1 second to 30 seconds, while a process temperature of the annealing process may range from 250° C. to 800° C. In alternative embodiments, a process time of the annealing process may range from 1 second to 5 hours, while a process temperature of the annealing process may range from 250° C. to 800° C. Furthermore, after the annealing process for nitridation, an additional annealing process as described with reference to FIG. 2A may or may not be further performed.

In other embodiments, the blocking layers 114, 116 are formed by a single chemical vapor deposition (CVD) process. In these embodiments, a first half of the CVD process is corresponding to formation of the blocking layer 114, while a second half of the CVD process is corresponding to formation of the blocking layer 116. In those embodiments where the blocking layer 114 includes an oxide material and the blocking layer 116 includes a nitrogen-doped oxide material, gas precursors used during the first half of the CVD process include an oxygen-containing precursor, while gas precursors used during the second half of the CVD process include a mixture of the oxygen-containing precursor and a nitrogen-containing precursor. After the CVD process, a post deposition annealing process as described with reference to FIG. 2A may or may not be further performed.

Similarly, a pulsed laser deposition (PLD) process or any other suitable deposition process may be used for forming the blocking layers 114, 116, as long as the blocking layer 116 can be formed with the elements for passivating the interfacial trap states (e.g., nitrogen) near an interface defined between the channel layer 102 and the ferroelectric layer 116.

Figure 4:
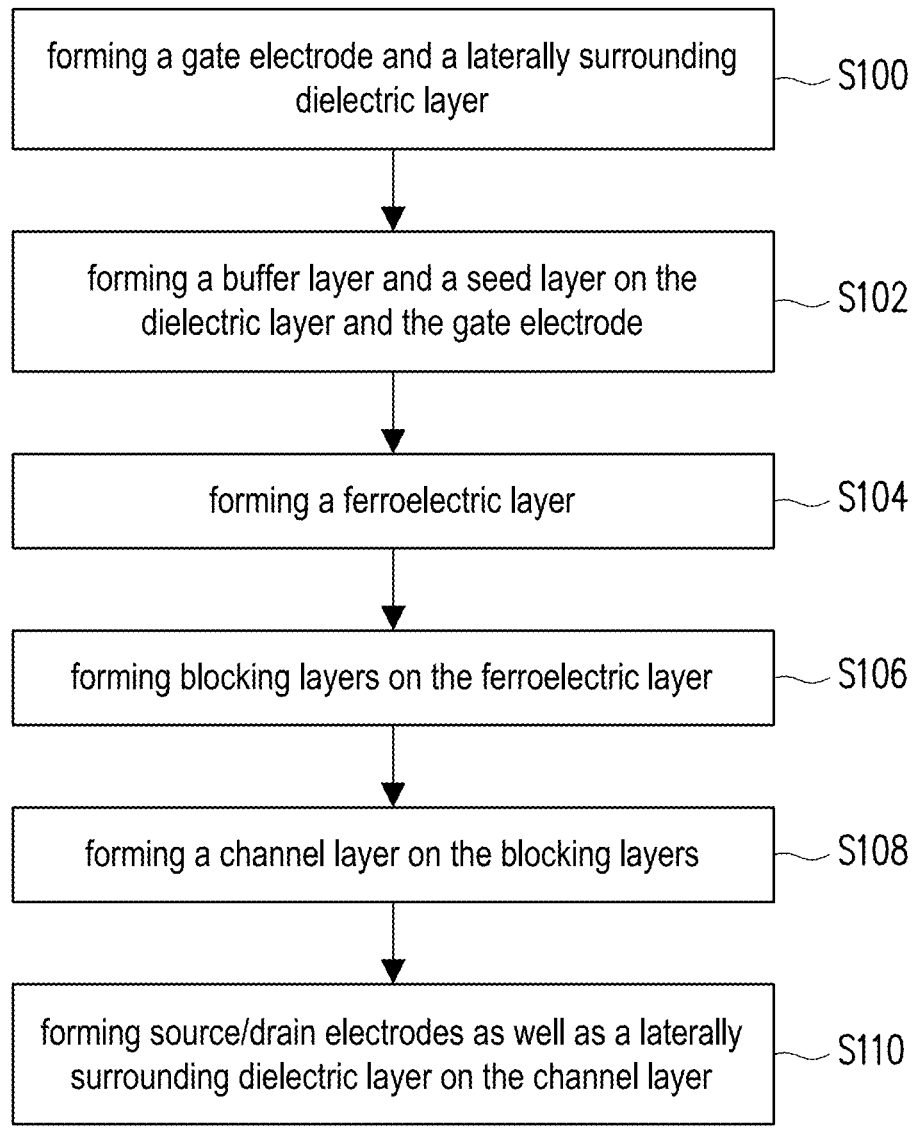
FIG. 4 is a flow diagram illustrating a method for forming the ferroelectric memory device as shown in FIG. 1A, according to some embodiments of the present disclosure.
Figure 5A:
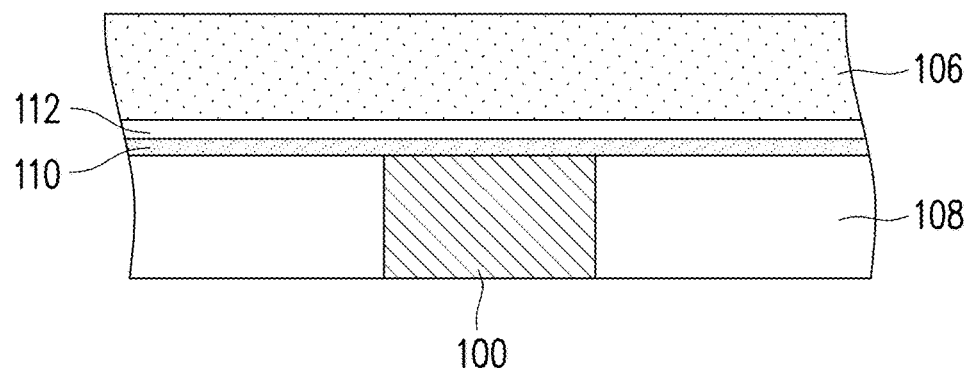
FIG. 5A through FIG. 5C are cross-sectional views illustrating intermediate structures during the manufacturing process as shown in FIG. 4.
Figure 5B:
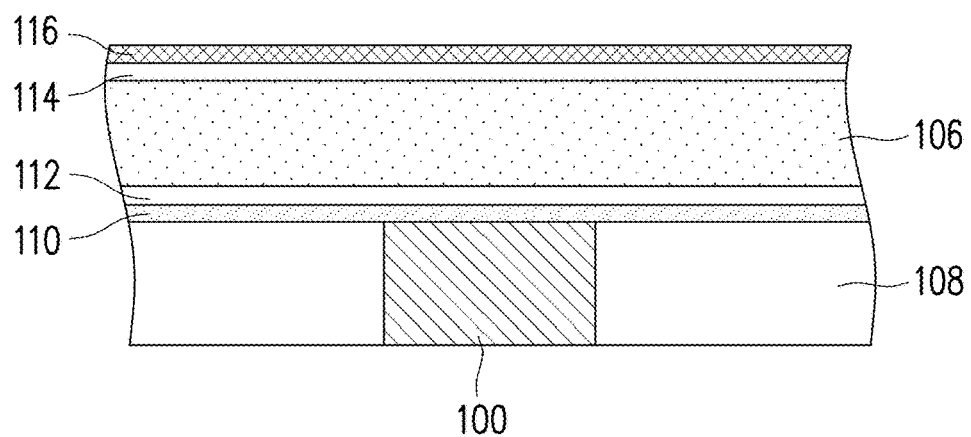
Figure 5C:
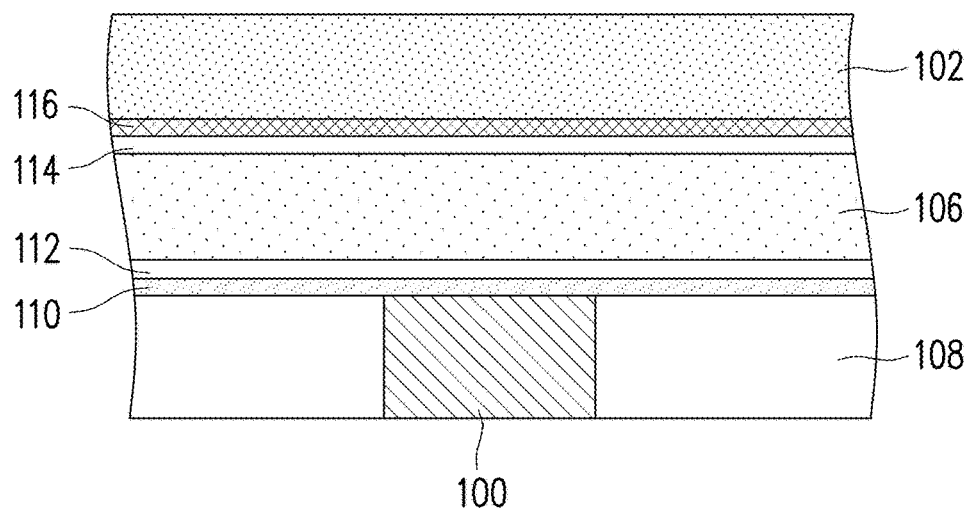

FIG. 4 is a flow diagram illustrating a method for forming the ferroelectric memory device 10 as shown in FIG. 1A, according to some embodiments of the present disclosure. FIG. 5A through FIG. 5C are cross-sectional views illustrating intermediate structures during the manufacturing process as shown in FIG. 4.

Referring to FIG. 4 and FIG. 5A, step S100 is performed, and the gate electrode 100 and the laterally surrounding dielectric layer 108 are formed. As described with reference to FIG. 1A, the dielectric layer 108 may be one of a stack of dielectric layers in a BEOL structure formed over a FEOL structure including active devices disposed on a semiconductor substrate. In addition, the gate electrode 100 may be a portion of a metallization layer formed in the stack of dielectric layers of the BEOL structure. In some embodiments, a damascene process may be used for forming the dielectric layer 108 and the gate electrode 100. The damascene process described in the present disclosure may include depositing a dielectric layer, forming at least one trench/hole in the dielectric layer, filling a conductive material in the trench/hole, and performing a planarization process to remove portions of the conductive material over the dielectric layer. For instance, the planarization process may include a polishing process, an etching process or a combination thereof.

In some embodiments, step S102 is then performed, to form the buffer layer 110 and the seed layer 112 on the dielectric layer 108 and the gate electrode 100. The buffer layer 110 and the seed layer 112 may be respectively formed by a deposition process. In some embodiments, the buffer layer 110 and the seed layer 112 are respectively formed by an ALD process. In alternative embodiments, the buffer layer 110 and the seed layer 112 are respectively formed by a CVD process, a physical vapor deposition (PVD) process or a PLD process.

Subsequently, step S104 is performed, and the ferroelectric layer 106 is formed. In those embodiments where the buffer layer 110 and the seed layer 112 are pre-formed on the dielectric layer 108 and the gate electrode 100, the ferroelectric layer 106 is formed on the seed layer 112. In alternative embodiments where the buffer layer 110 and the seed layer 112 are omitted, the ferroelectric layer 106 may be formed on the dielectric layer 108 and the gate electrode 100. A method for forming the ferroelectric layer 106 may include a deposition process. In some embodiments, the deposition process is an ALD process. In alternative embodiments, the deposition process is a CVD process, a PVD process or a PLD process. Moreover, an annealing process may be performed after the deposition process. A process temperature of the post deposition annealing process may range from 250° C. to 800° C., and a process time of the post deposition annealing process may range from 1 second to 5 hours. In addition, the post deposition annealing process may be performed in $N_2$ ambient. Alternatively, the annealing process after deposition of the ferroelectric layer 106 may be omitted.

Referring to FIG. 4 and FIG. 5B, step S106 is performed, and the blocking layers 114, 116 are formed on the ferroelectric layer 106. The blocking layers 114, 116 may be formed by any of the methods described with reference to FIG. 2A, FIG. 2B and FIG. 3. However, any other suitable process may be used for forming the blocking layers 114, 116, as long as the blocking layer 116 can be formed with the elements for passivating the interfacial trap states (e.g., nitrogen) near an interface defined between the ferroelectric layer 116 and the subsequently formed channel layer 102.

Referring to FIG. 4 and FIG. 5C, step S108 is performed, and the channel layer 102 is formed on the blocking layers 114, 116. In some embodiments where the channel layer 102 is formed of an oxide semiconductor material, a method for forming the channel layer 102 includes a deposition process. As an example, the deposition process may be an ALD process. Alternatively, the deposition process may be a CVD process, a PVD process or a PLD process. In those embodiments where the channel layer 102 is formed of a group IV semiconductor material or a group III-V semiconductor material, a method for forming the channel layer 102 may include a deposition process (e.g., an ALD process or a CVD process) or an epitaxial process. In addition, a post annealing process may or may not be performed on the channel layer 102.

Referring to FIG. 4 and FIG. 1A, step S110 is performed, and the source/drain electrodes 104 as well as the laterally surrounding dielectric layer 118 are formed on the channel layer 102. In some embodiments, a damascene process may be used for forming the dielectric layer 118 and the source/drain electrodes 104.

Up to here, the ferroelectric memory device 10 as shown in FIG. 1A has been formed. Subsequently, further BEOL process may be performed to out rout the gate electrode 100 as well as the source/drain electrodes 104, and to complete formation of the BEOL structure.

Figure 6A:
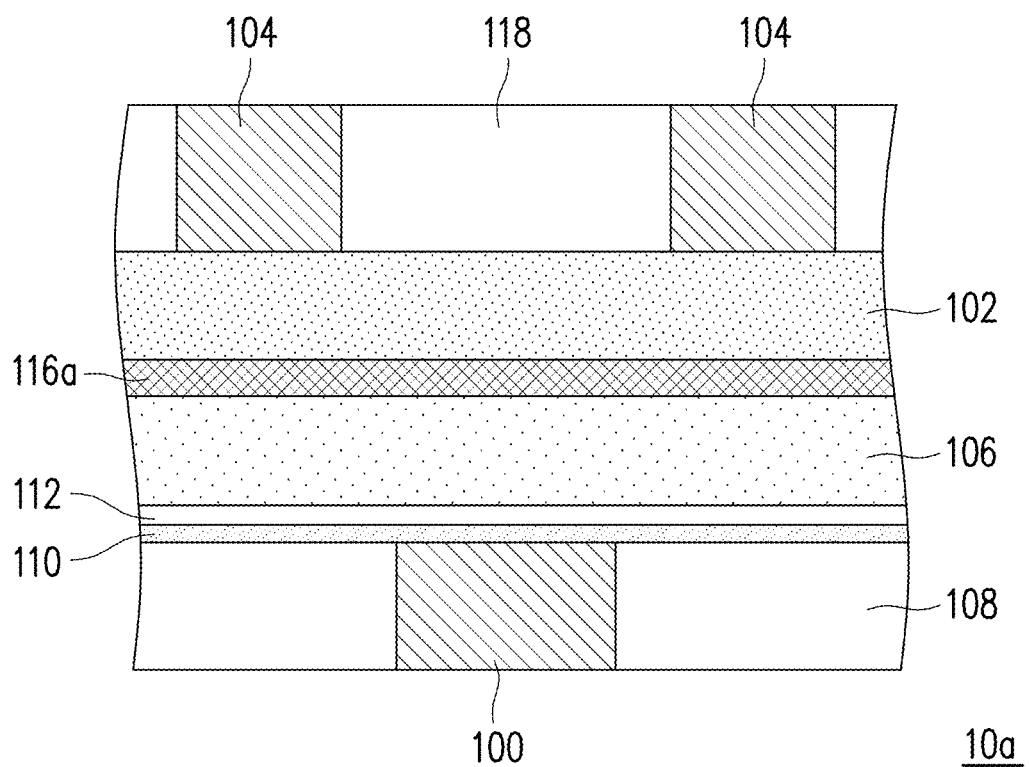
FIG. 6A through FIG. 6D are schematic cross-sectional views illustrating ferroelectric memory devices, according to some embodiments of the present disclosure.

FIG. 6A is a schematic cross-sectional view illustrating a ferroelectric memory device 10a, according to some embodiments of the present disclosure. The ferroelectric memory device 10a is similar to the ferroelectric memory device 10 as described with reference to FIG. 1A. Only the differences between the ferroelectric memory devices 10, 10a will be described. The same or the like parts of the ferroelectric memory devices 10, 10a would not be repeated again. In addition, similar numeral references indicate the same or the like components (e.g., the blocking layer 116 and the blocking layer 116a).

Referring to FIG. 6A, the blocking layer 114 as described with reference to FIG. 1A may be omitted. The blocking layer 116a, which is similar to the blocking layer 116 in terms of material candidates and formation method as described with reference to FIG. 1A, may be in contact with the underlying ferroelectric layer 106 and the overlying channel layer 102. In addition, the blocking layer 116a may be formed to a thickness greater than or substantially equal to a thickness of the blocking layer 116 as described with reference to FIG. 1A. In some embodiments, the thickness of the blocking layer 116a is substantially equal to a total thickness of the blocking layers 114, 116 as described with reference to FIG. 1A. Alternatively, the thickness of the blocking layer 116a may be less than the thickness of the blocking layer 116 as described with reference to FIG. 1A. For instance, a thickness of the blocking layer 116a may range from 0.1 nm to 5 nm. Further, the blocking layer 116a may be formed of one or a combination of more than one of the material candidates for forming the blocking layer 116, as described with reference to FIG. 1A.

A method for forming the blocking layer 116a may be similar to the method for forming the blocking layer 116, as described with reference to FIG. 2A, FIG. 2B and FIG. 3. In those embodiments where the blocking layer 116a is formed by an ALD process, the deposition cycles 204 and the deposition cycles 210 as described with reference FIG. 2A may be alternately performed to achieve the expected thickness of the blocking layer 116a. Alternatively, the deposition cycles 210' described with reference to FIG. 2B may be consecutively performed in an ALD process for forming the blocking layer 116a. In addition, a post deposition annealing as described with reference to FIG. 2A may be performed on the as-deposited blocking layer 116a.

In other embodiments where the blocking layer 116a by a deposition process and a nitridation process, the deposited initial blocking layer 300 as described with reference to FIG. 3 may be entirely nitrided to form the blocking layer 116a. In yet other embodiments where the blocking layer 116a is formed by a CVD process, a precursor containing elements for passivating the interfacial trap states (e.g., a nitrogen-containing precursor) may be provided along with other precursors during the CVD process. Similarly, a PLD process or any other suitable deposition process may be used for forming the blocking layer 116a, as long as the blocking layer 116a can be formed with the elements for passivating the interfacial trap states (e.g., nitrogen).

Figure 6B:
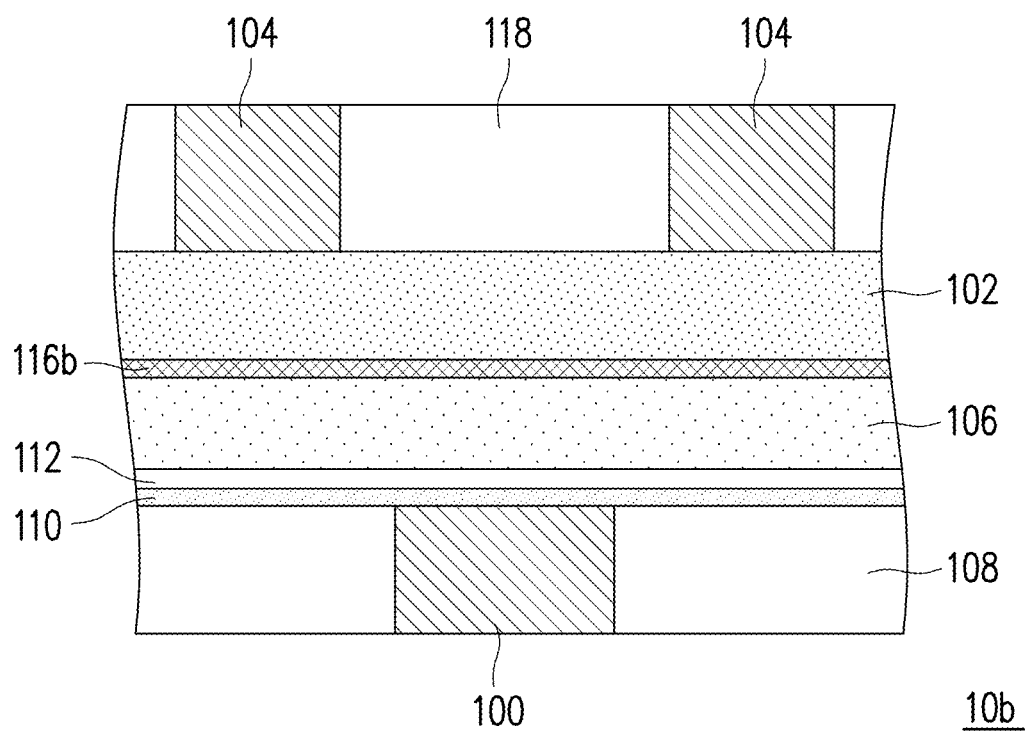

FIG. 6B is a schematic cross-sectional view illustrating a ferroelectric memory device 10b, according to some embodiments of the present disclosure. The ferroelectric memory device 10b is similar to the ferroelectric memory device 10 as described with reference to FIG. 1A. Only the differences between the ferroelectric memory devices 10, 10b will be described. The same or the like parts of the ferroelectric memory devices 10, 10b would not be repeated again. In addition, similar numeral references indicate the same or the like components (e.g., the blocking layer 116 and the blocking layer 116b).

Referring to FIG. 6B, the blocking layers 114, 116 as described with reference to FIG. 1A are omitted, and a top portion of the ferroelectric layer 106 is turned into a blocking layer 116b. As similar to the blocking layer 116 as described with reference to FIG. 1A, the blocking layer 116b may be in contact with the overlying channel layer 102, and is configured to passivate the interfacial trap states near an interface defined between the channel layer 102 and the ferroelectric layer 106. In those embodiments where the ferroelectric layer 106 is formed of an oxide material, the top portion of the ferroelectric layer 106 is further incorporated with nitrogen to form the blocking layer 116b. As an example, the ferroelectric layer 106 may be formed of hafnium zirconium oxide (HfZrO), and the blocking layer 116b may be formed of nitrogen doped hafnium zirconium oxide (N:HfZrO). In some embodiments, a thickness of the blocking layer 116b ranges from 0.1 nm to 5 nm.

In those embodiments where the ferroelectric layer 106 is formed by an ALD process, deposition cycles with a precursor containing the elements for passivating the interfacial trap states (e.g., nitrogen) and deposition cycles without such precursor may be alternately performed in an end portion of the ALD process, to form the blocking layer 116b. Such method for forming the blocking layer 116b is similar to the method described with reference to FIG. 2A. Alternatively, as similar to the method described with reference to FIG. 2B, the deposition cycles with such precursor may be consecutively performed in the end portion of the ALD process, to form the blocking layer 116b. In addition, a post deposition annealing as described with reference to FIG. 2A may be performed on the as-deposited blocking layer 116b.

In other embodiments, as similar to the method described with reference to FIG. 3, a nitridation process is used for turning a top portion of an as-deposited ferroelectric layer 106 into the blocking layer 116b. In yet other embodiments where the ferroelectric layer 106 is formed by a CVD process, a precursor containing elements for passivating the interfacial trap states (e.g., a nitrogen-containing precursor) may be provided along with other precursors during an end portion of the CVD process, to form the blocking layer 116b. Similarly, a PLD process or any other suitable deposition process may be used for forming the blocking layer 116b, as long as the blocking layer 116b can be formed with the elements for passivating the interfacial trap states (e.g., nitrogen).

Figure 6C:
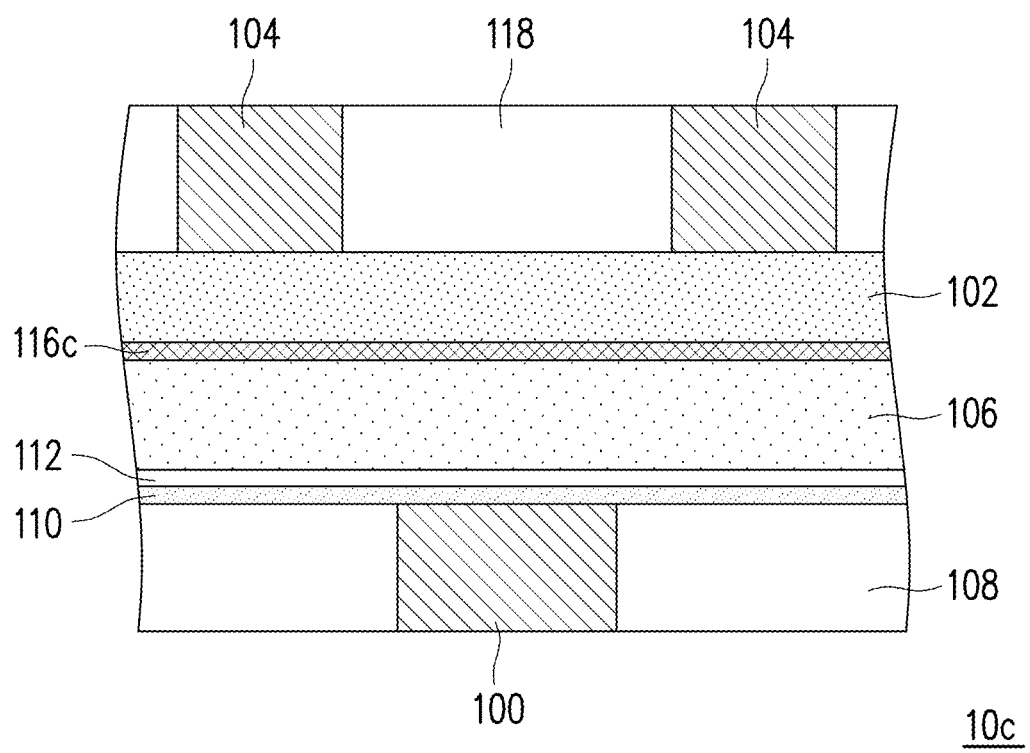

FIG. 6C is a schematic cross-sectional view illustrating a ferroelectric memory device 10c, according to some embodiments of the present disclosure. The ferroelectric memory device 10c is similar to the ferroelectric memory device 10 as described with reference to FIG. 1A. Only the differences between the ferroelectric memory devices 10, 10c will be described. The same or the like parts of the ferroelectric memory devices 10, 10c would not be repeated again. In addition, similar numeral references indicate the same or the like components (e.g., the blocking layer 116 and the blocking layer 116c).

Referring to FIG. 6C, the blocking layers 114, 116 as described with reference to FIG. 1A are omitted, and a bottom portion of the channel layer 102 is turned into a blocking layer 116c. In this way, the blocking layer 116c may be in contact with the underlying ferroelectric layer 106. As similar to the blocking layer 116 as described with reference to FIG. 1A, the blocking layer 116c is configured to passivate the interfacial trap states. However, the blocking layer 116c may not be ferroelectric. In those embodiments where the channel layer 102 is formed of an oxide semiconductor material, the bottom portion of the channel layer 102 is further incorporated with nitrogen to form the blocking layer 116c. As an example, the channel layer 102 may be formed of IGZO, and the blocking layer 116c may be formed of nitrogen doped IGZO (N:IGZO). In some embodiments, a thickness of the blocking layer 116c ranges from 0.1 nm to 5 nm.

In those embodiments where the channel layer 102 is formed by an ALD process, deposition cycles with a precursor containing the elements for passivating the interfacial trap states (e.g., nitrogen) and deposition cycles without such precursor may be alternately performed in an opening portion of the ALD process, to form the blocking layer 116c. Such method for forming the blocking layer 116c is similar to the method described with reference to FIG. 2A. Alternatively, as similar to the method described with reference to FIG. 2B, the deposition cycles with such precursor may be consecutively performed in the opening portion of the ALD process, to form the blocking layer 116c. In addition, a post deposition annealing as described with reference to FIG. 2A may be performed on the as-deposited blocking layer 116c.

In other embodiments, a bottom portion of the channel layer 102 to be processed for forming the blocking layer 116c is initially deposited, and a nitridation process is used for turning such bottom portion of the channel layer 102 into the blocking layer 116c. Subsequently, rest portion of the channel layer 102 is formed on the blocking layer 116c. Such method is similar to the method as described with reference to FIG. 3. In yet other embodiments where the channel layer 102 is formed by a CVD process, a precursor containing elements for passivating the interfacial trap states (e.g., a nitrogen-containing precursor) may be provided along with other precursors during an opening portion of the CVD process, to form the blocking layer 116c. Similarly, a PLD process or any other suitable deposition process may be used for forming the blocking layer 116c, as long as the blocking layer 116c can be formed with the elements for passivating the interfacial trap states (e.g., nitrogen).

Figure 6D:
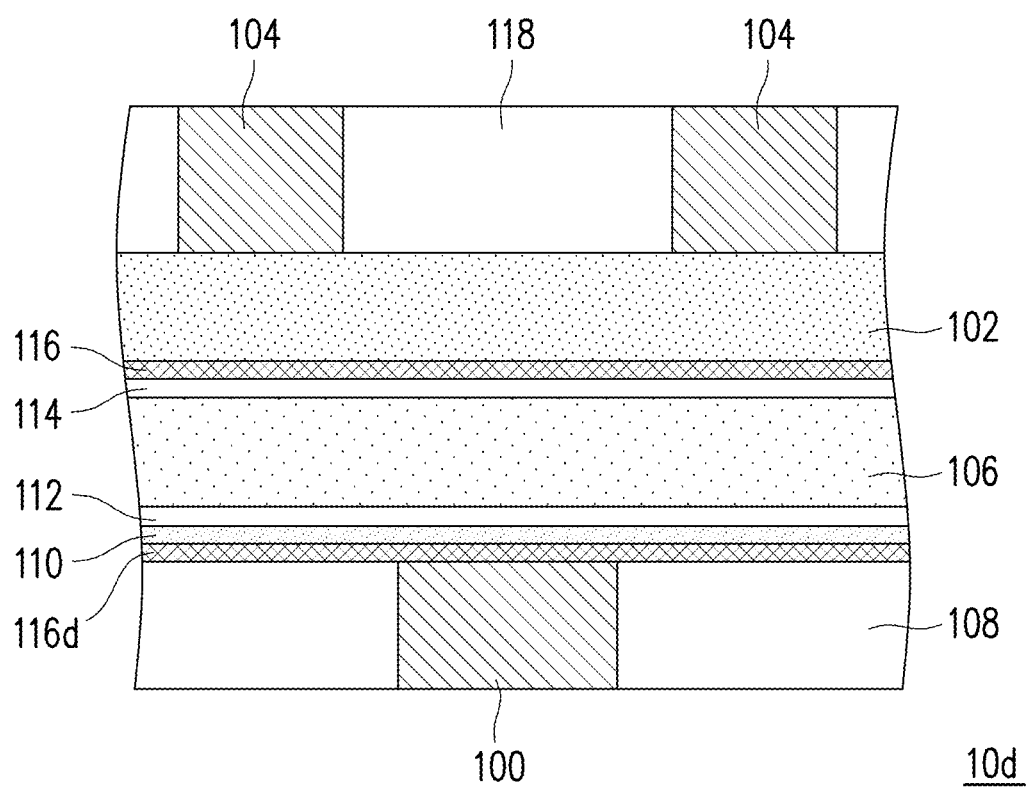

FIG. 6D is a schematic cross-sectional view illustrating a ferroelectric memory device 10d, according to some embodiments of the present disclosure. The ferroelectric memory device 10d is similar to the ferroelectric memory device 10 as described with reference to FIG. 1A. Only the differences between the ferroelectric memory devices 10, 10d will be described. The same or the like parts of the ferroelectric memory devices 10, 10d would not be repeated again. In addition, similar numeral references indicate the same or the like components (e.g., the blocking layer 116 and the blocking layer 116d).

Referring to FIG. 6D, a blocking layer 116d, which is similar to the blocking layer 116 as described with reference to FIG. 1A, is further disposed between the seed layer 112 and the gate electrode 100. The blocking layer 116d is configured to passivate trap states at an interface defined between the ferroelectric layer 106 and the gate electrode 100. In some embodiments, the buffer layer 110 lies under the seed layer 112, and the blocking layer 116d may be sandwiched between the buffer layer 110 and the gate electrode 100. The blocking layer 116d may be formed of one or a combination of more than one of the material candidates for forming the blocking layer 116, as described with reference to FIG. 1A. In some embodiments, the blocking layers 114, 116, 116d include the same material, while the blocking layers 116, 116d are further incorporated with nitrogen. Further, the blocking layer 116d may be formed to a thickness within the thickness range of the blocking layer 116, as described with reference to FIG. 1A.

A method for forming the blocking layer 116d may be similar to the method for forming the blocking layer 116, as described with reference to FIG. 2A, FIG. 2B and FIG. 3. In those embodiments where the blocking layer 116d is formed by an ALD process, the deposition cycles 204 and the deposition cycles 210 as described with reference FIG. 2A may be alternately performed until the expected thickness of the blocking layer 116d is achieved. Alternatively, the deposition cycles 210' described with reference to FIG. 2B may be consecutively performed in an ALD process for forming the blocking layer 116d. In addition, a post deposition annealing as described with reference to FIG. 2A may be performed on the as-deposited blocking layer 116d.

In other embodiments where the blocking layer 116d is formed by a deposition process and a nitridation process, a deposited initial blocking layer may be nitrided to form the blocking layer 116d, as similar to a method described with reference to FIG. 3. In yet other embodiments where the blocking layer 116d is formed by a CVD process, a precursor containing elements for passivating the interfacial trap states (e.g., a nitrogen-containing precursor) may be provided along with other precursors during the CVD process. Similarly, a PLD process or any other suitable deposition process may be used for forming the blocking layer 116d, as long as the blocking layer 116d can be formed with the elements for passivating the interfacial trap states (e.g., nitrogen).

Figure 7A:
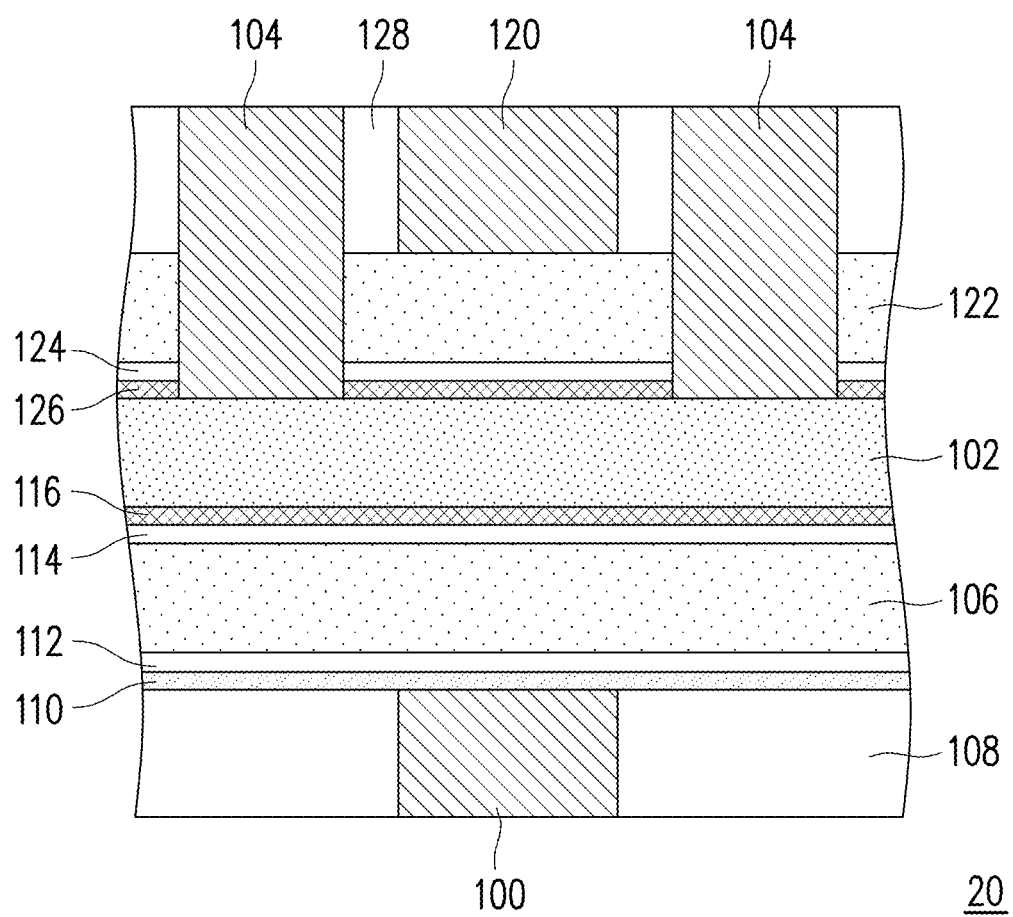
FIG. 7A is a schematic cross-sectional view illustrating a ferroelectric memory device, according to some embodiments of the present disclosure.
Figure 7B:
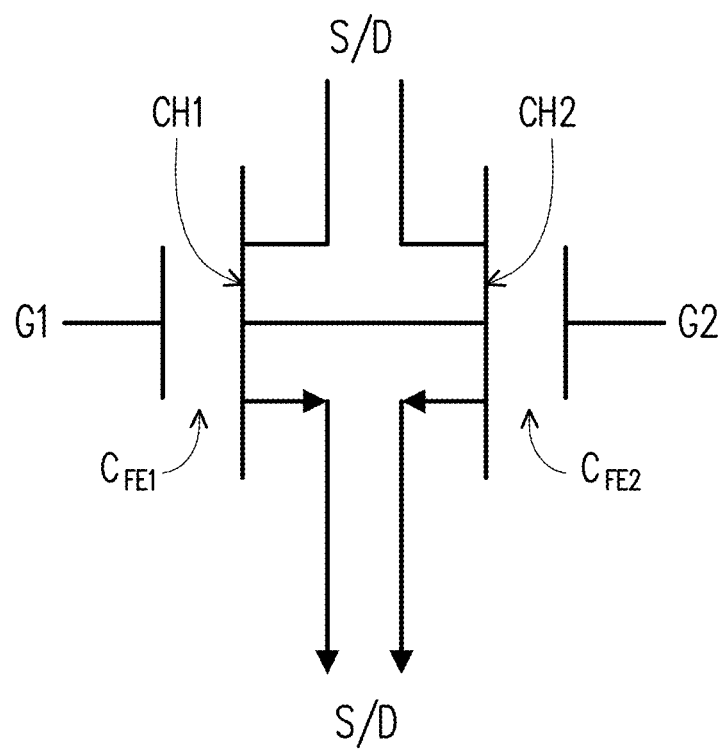
FIG. 7B is a circuit diagram of the ferroelectric memory device as shown in FIG. 7A.

FIG. 7A is a schematic cross-sectional view illustrating a ferroelectric memory device 20, according to some embodiments of the present disclosure. FIG. 7B is a circuit diagram of the ferroelectric memory device 20 as shown in FIG. 7A. The ferroelectric memory device 20 is similar to the ferroelectric memory device 10 as described with reference to FIG. 1A. Only the differences between the ferroelectric memory devices 10, 20 will be described. The same or the like parts of the ferroelectric memory devices 10, 20 would not be repeated again.

Referring to FIG. 7A, the ferroelectric memory device 20 may be a double gate ferroelectric FET. Another gate electrode 120 is disposed over the channel layer 102, and an additional ferroelectric layer 122 spans between the gate electrode 120 and the channel layer 102. In this way, the channel layer 102 is capacitively coupled to the gate electrode 100 and the gate electrode 120 through the ferroelectric layer 106 and the ferroelectric layer 122, respectively. The gate electrode 120 is similar to the gate electrode 100 in terms of material candidates, dimension (e.g., thickness range) and formation method, and the ferroelectric layer 122 is similar to the ferroelectric layer 106 in terms of material candidates, dimension (e.g., thickness range) and formation method.

In some embodiments, additional blocking layers 124, 126, which are similar to the blocking layers 114, 116 in terms of material candidates, dimension (e.g., thickness range) and formation method, are disposed between the channel layer 102 and the ferroelectric layer 122. The blocking layer 126 may be in contact with the channel layer 102, while the blocking layer 124 may be in contact with the ferroelectric layer 122. The blocking layers 124, 126 may include the same material selected to enhance conduction band offset and valence band offset with respect to conduction and valence bands of the channel layer 102, in order to block the leakage current entering the ferroelectric layer 122 from the channel layer 102. In addition, the blocking layer 126 is further incorporated with elements for passivating trap states near an interface defined between the channel layer 102 and the ferroelectric layer 122. In those embodiments where the blocking layers 124, 126 respectively include an oxide material, the blocking layer 126 may be further incorporated with nitrogen, so as to passivate the interfacial trap states. As similar to the blocking layers 114, 116, the blocking layers 124, 126 may include the same oxide material, and the blocking layer 126 is further nitrified.

The source/drain electrodes 104 located at opposite sides of the gate electrode 120 may penetrate through the ferroelectric layer 122, to establish electrical contact with the channel layer 102. In some embodiments, portions of the source/drain electrodes 104 above the ferroelectric layer 122 and the gate electrode 120 may be laterally surrounded by a dielectric layer 128.

Referring to FIG. 7A and FIG. 7B, the gate electrodes 100, 120 may be functioned as gate terminals G1, G2 of the double gate ferroelectric FET, respectively. In addition, the source/drain electrodes 104 may be functioned as source/drain terminals S/D of the double gate ferroelectric FET. Conduction channels CH1, CH2 extend between the source/drain terminals S/D and capacitively coupled to the gate terminals G1, G2, respectively. The conduction channels CH1, CH2 are established in the same channel layer 102, thus are depicted as being connected with each other. A gate capacitor $C_{FE1}$ between the gate terminal G1 and the conduction channel CH1 may be formed across the layers including the ferroelectric layer 106, and may be referred as a ferroelectric capacitor. Similarly, a gate capacitor $C_{FE2}$ between the gate terminal G2 and the conduction channel CH2 may be formed across the layers including the ferroelectric layer 122, and may be referred as a ferroelectric capacitor as well.

Figure 8:
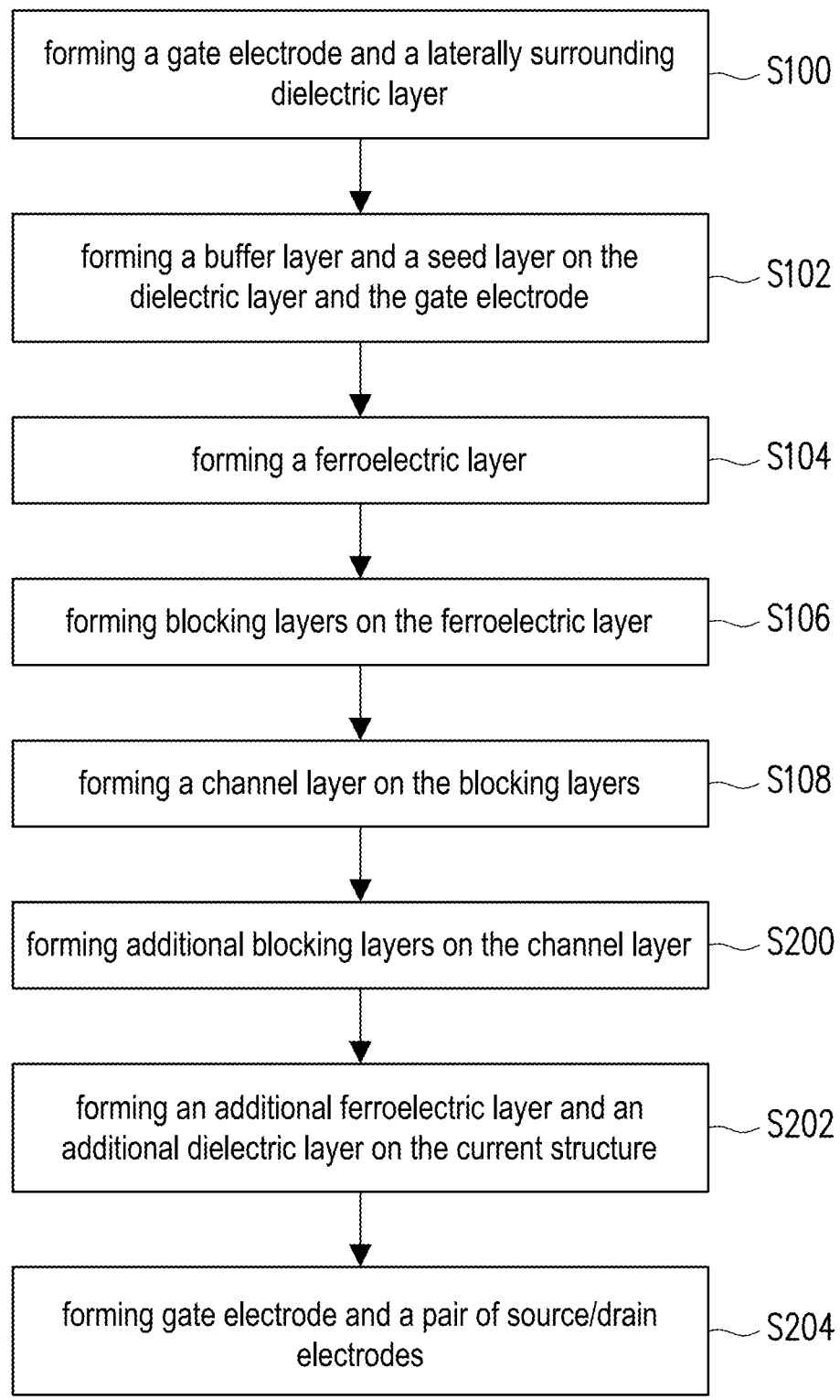
FIG. 8 is a flow diagram illustrating a method for forming the ferroelectric memory device as shown in FIG. 7A, according to some embodiments of the present disclosure.
Figure 9A:
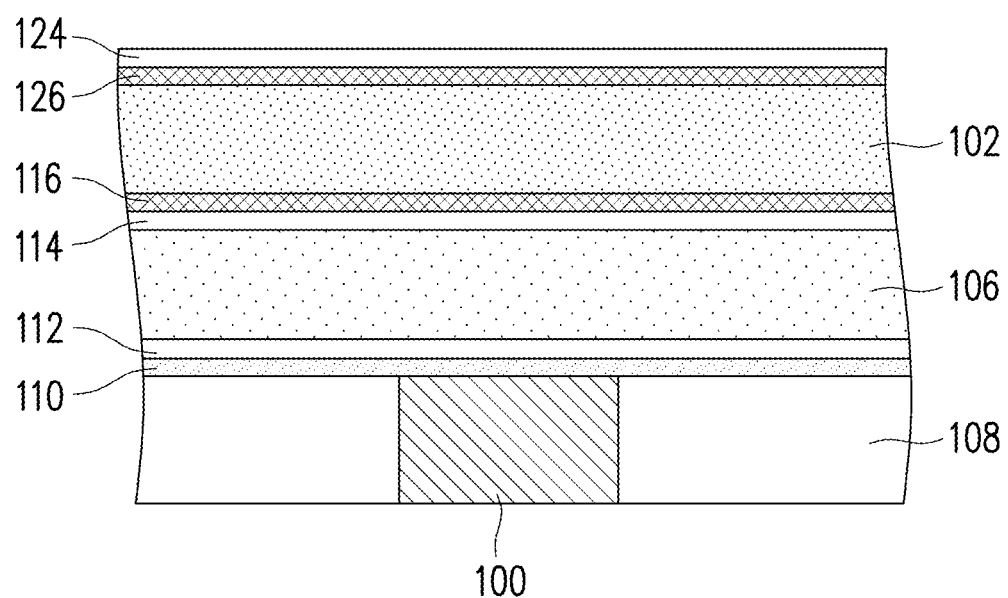
FIG. 9A and FIG. 9B are cross-sectional views illustrating intermediate structures during the manufacturing process as shown in FIG. 8.
Figure 9B:
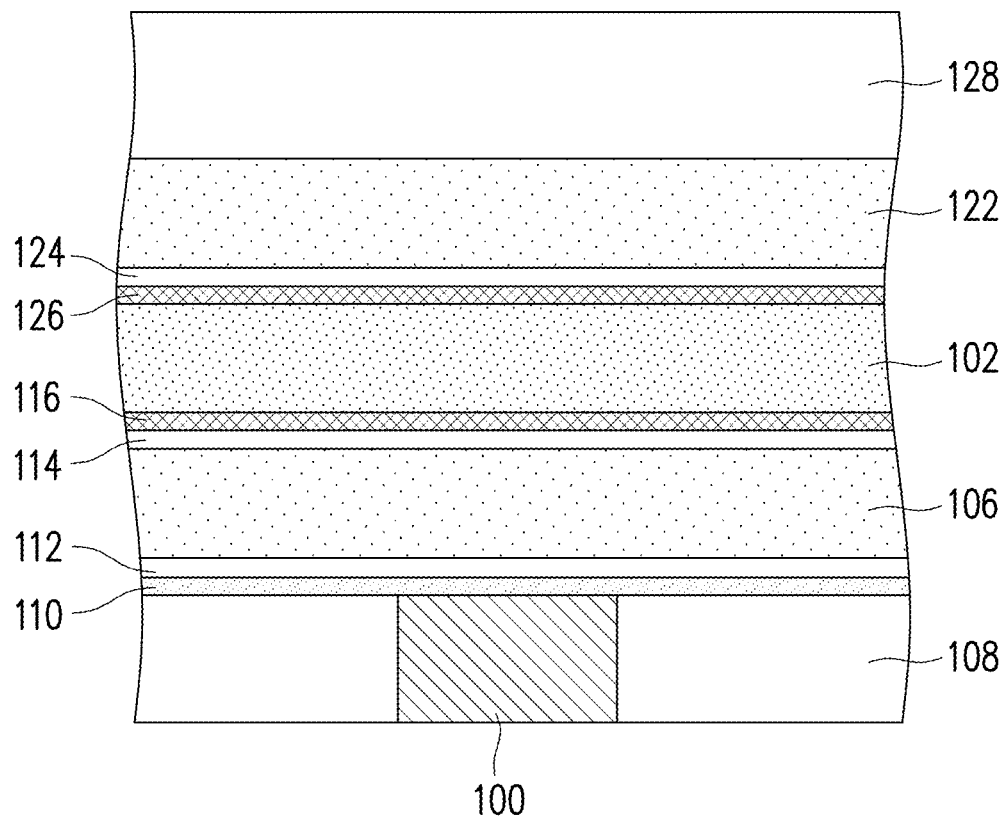

FIG. 8 is a flow diagram illustrating a method for forming the ferroelectric memory device 20 as shown in FIG. 7A, according to some embodiments of the present disclosure. FIG. 9A and FIG. 9B are cross-sectional views illustrating intermediate structures during the manufacturing process as shown in FIG. 8.

Referring to FIG. 8 and FIG. 9A, steps S100, S102, S104, S106, S108 as described with reference to FIG. 4 and FIG. 5A through FIG. 5C are initially performed. Subsequently, step S200 is performed, and the blocking layers 124, 126 are formed on the channel layer 102. In those embodiments where the blocking layers 124, 126 are formed by an ALD process, the deposition cycles 204, 210 as described with reference to FIG. 2A may be alternatively performed to form the blocking layer 126, and then the deposition cycles 204 may be consecutively performed to form the blocking layer 124. Alternatively, the deposition cycles 210' as described with reference to FIG. 2B may be consecutively performed to form the blocking layer 126, and then the deposition cycles 204 may be consecutively performed to form the blocking layer 124. In addition, a post deposition annealing process may be performed on the as-deposited blocking layers 124, 126 as described with reference to FIG. 2A.

In alternative embodiments, as similar to the method described with reference to FIG. 3, an initial blocking layer is deposited on the channel layer 102, and then turned into the blocking layer 126 by, for example, a nitridation process. Subsequently, the blocking layer 124 may be formed on the blocking layer 126 by a deposition process. In addition, a post annealing process as described with reference to FIG. 2A may be performed on the blocking layers 124, 126.

In other embodiments, the blocking layers 124, 126 are formed by a CVD process, and a first half of the CVD process is corresponding to formation of the blocking layer 126, while a second half of the CVD process is corresponding to formation of the blocking layer 124. In those embodiments where the blocking layer 126 includes a nitrogen-doped oxide material and the blocking layer 124 includes an oxide material, a mixture of an oxygen-containing precursor and a nitrogen-containing precursor is used during the first half of the CVD process for forming the blocking layer 126, and the oxygen-containing precursor is used during the second half of the CVD process for forming the blocking layer 124. After the CVD process, a post deposition annealing process as described with reference to FIG. 2A may or may not be further performed.

Similarly, a PLD process or any other suitable deposition process may be used for forming the blocking layers 124, 126, as long as the blocking layer 126 can be formed with the elements for passivating the interfacial trap states (e.g., nitrogen) near an interface defined between the channel layer 102 and the ferroelectric layer 122.

Referring to FIG. 8 and FIG. 9B, step S202 is performed, and the ferroelectric layer 122 as well as the dielectric layer 128 are formed on the blocking layer 124. The ferroelectric layer 122 may be formed by a method for forming the ferroelectric layer 106, as described with reference to FIG. 5A. On the other hand, the dielectric layer 128 may be formed by a deposition process, such as a CVD process.

Referring to FIG. 8 and FIG. 7A, step S204 is performed, and the gate electrode 120 as well as the source/drain electrodes 104 are formed. In some embodiments, a method for forming the gate electrode 120 and the source/drain electrodes 104 includes forming openings in the dielectric layer 128. The openings for accommodating the source/drain electrodes 104 may further extend through the ferroelectric layer 122 and the blocking layers 124, 126 to the channel layer 102, while the opening for accommodating the gate electrode 120 may extend to a top surface of the ferroelectric layer 122. A method for forming these openings may include a lithography process and one or more etching processes. Subsequently, a conductive material may be filled into these openings by a deposition process, a plating process or a combination thereof, and portions of the conductive material over the dielectric layer 128 may be removed by a planarization process. Remained portions of the conductive material in the openings form the gate electrode 120 and the source/drain electrodes 104. The planarization process may include, for example, a polishing process, an etching process or a combination thereof.

Up to here, the ferroelectric memory device 20 as shown in FIG. 7A has been formed. Subsequently, further BEOL process may be performed to out rout the gate electrodes 100, 120 as well as the source/drain electrodes 104, and to complete formation of the BEOL structure. Moreover, variations of the blocking layers as described with reference to FIG. 6A through FIG. 6C may also be applied on the blocking layers 124, 126 as shown in FIG. 7A. That is, the blocking layer 124 may be omitted, and/or the blocking layer 126 may alternatively be formed by a bottom portion of the ferroelectric layer 122 or a top portion of the channel layer 102. In addition, as another alternative described with reference to FIG. 6D, an additional ferroelectric layer may be further disposed between the gate electrode 100 and the ferroelectric layer 106. Similarly, an additional blocking layer may be further disposed between the ferroelectric layer 122 and the gate electrode 120, so as to passivate trap states at an interface defined between the ferroelectric layer 122 and the gate electrode 120.

Figure 10A:
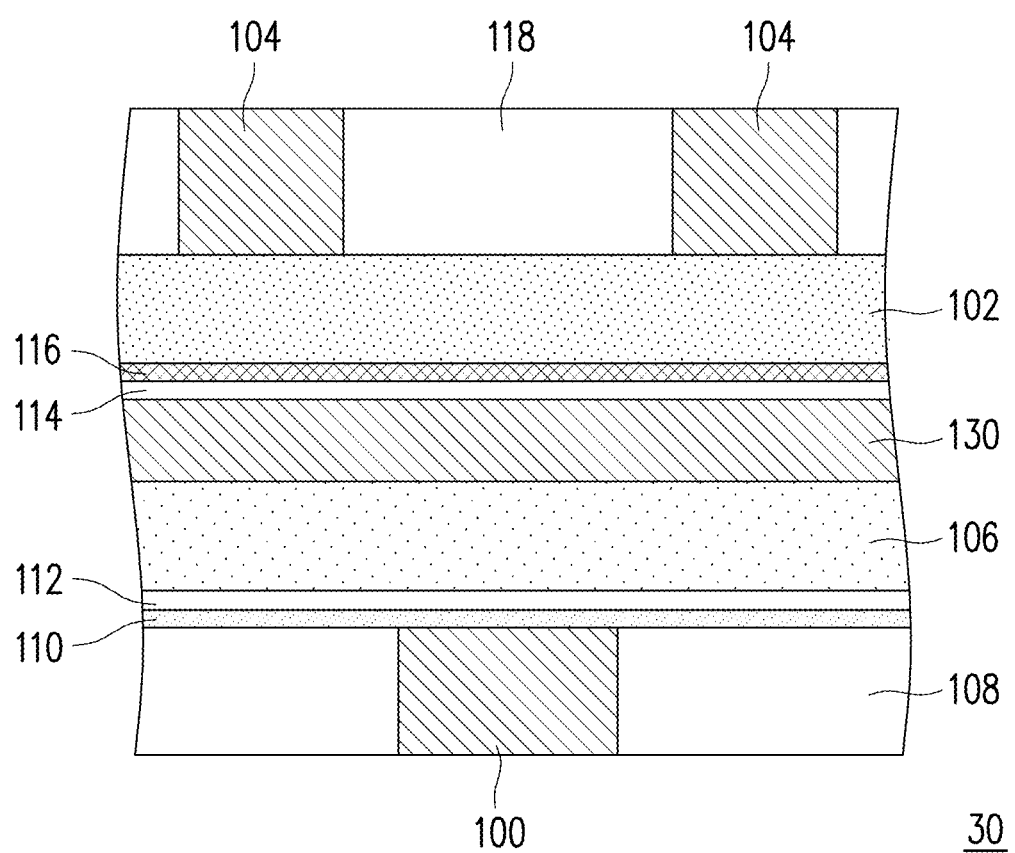
FIG. 10A is a schematic cross-sectional view illustrating a ferroelectric memory device, according to some embodiments of the present disclosure.
Figure 10B:
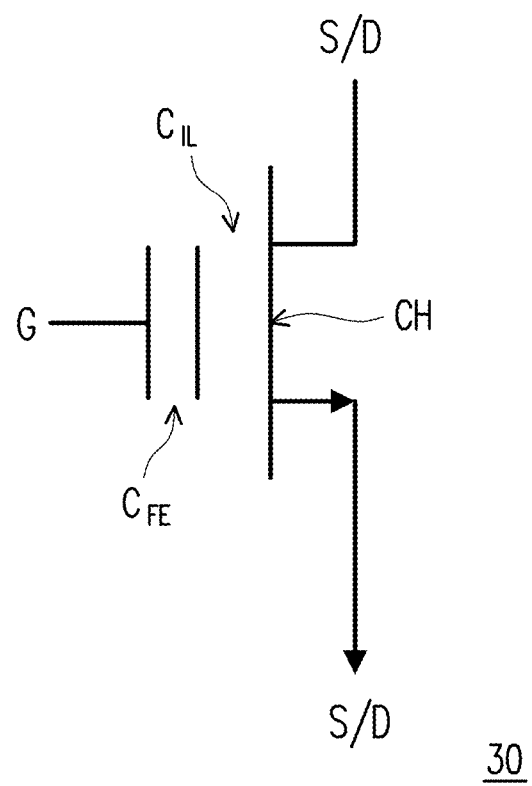
FIG. 10B is a circuit diagram of the ferroelectric memory device 30 as shown in FIG. 10A.

FIG. 10A is a schematic cross-sectional view illustrating a ferroelectric memory device 30, according to some embodiments of the present disclosure. FIG. 10B is a circuit diagram of the ferroelectric memory device 30 as shown in FIG. 10A. The ferroelectric memory device 30 is similar to the ferroelectric memory device 10 as described with reference to FIG. 1A. Only the differences between the ferroelectric memory devices 10, 30 will be described. The same or the like parts of the ferroelectric memory devices 10, 30 would not be repeated again.

Referring to FIG. 10A, the ferroelectric memory device 30 may be a metal-ferroelectric-metal-insulator-semiconductor (MFMIS) FET, and includes a floating gate layer 130 inserted between the channel layer 102 and the ferroelectric layer 106. In some embodiments, the blocking layers 114, 116 are sandwiched between the channel layer 102 and the floating gate layer 130. In these embodiments, a gate capacitor between the floating gate layer 130 and the channel layer 102 is formed across the blocking layers 114, 116, and may be referred as a metal-insulator-semiconductor (MIS) capacitor. On the other hand, a gate capacitor between the floating gate layer 130 and the gate electrode 100 is formed across layers including the ferroelectric layer 106, and may be referred as a metal-ferroelectric-metal (MFM) capacitor or a ferroelectric capacitor. The MIS capacitor is connected with the MFM capacitor the shared floating gate layer 130, thus the MIS capacitor and the MFM capacitor are serially connected. In some embodiments, the floating gate layer 130 is electrically floated. The floating gate layer 130 may be formed of one or a combination of more than one of the candidates of the conductive material for forming the gate electrode 100, as described with reference to FIG. 1A. In some embodiments, a thickness of the floating gate layer 130 ranges from 1 nm to 1000 nm. By inserting the floating gate layer 130 between the ferroelectric layer 106 and the channel layer 102, intermixing of the ferroelectric layer 106 and the channel layer 102 may be further prevented, and the interface defined between the ferroelectric layer 106 and the channel layer 102 may be improved. Further, the floating gate layer 130 can effectively apply electric field on the ferroelectric layer 106 and improve the polarization value.

Referring to FIG. 10A and FIG. 10B, the gate electrode 100 may be functioned as a gate terminal G of the MFMIS FET, and the source/drain electrodes 104 may be functioned as source/drain terminals S/D of the MFMIS FET. A conduction channel CH extending between the source/drain terminals S/D may be established in the channel layer 102. The MFM capacitor defined between the gate electrode 100 (i.e., the gate terminal G) and the floating gate layer 130 is indicated by a gate capacitor $C_{FE}$. In addition, the MIS capacitor defined between the floating gate layer 130 and the channel layer 102 (i.e., the conduction channel CH) is indicated by a gate capacitor $C_{IL}$. As shown in FIG. 10B, the gate capacitor $C_{FE}$ and the gate capacitor $C_{IL}$ are in serial connection between the gate terminal G and the conduction channel CH.

A method for forming the ferroelectric memory device 30 is similar to the method for forming the ferroelectric memory device 10, as described with reference to FIG. 4, FIG. 5A through FIG. 5C and FIG. 1A, except that a step of forming the floating gate layer 130 is further performed after formation of the ferroelectric layer 106 and before formation of the blocking layers 114, 116. In some embodiments, a method for forming the floating gate layer 130 includes a deposition process, a plating process or a combination thereof.

Moreover, variations described with reference to FIG. 6A and FIG. 6C may also be applied on the embodiments shown in FIG. 10A and FIG. 10B. That is, the blocking layer 114 may be omitted, and/or the blocking layer 116 may alternatively be formed by a bottom portion of the channel layer 102. In addition, as another alternative described with reference to FIG. 6D, an additional blocking layer may be further disposed between the ferroelectric layer 106 and the gate electrode 100, in order to passivate trap states near an interface defined between the ferroelectric layer 106 and the gate electrode 100.

Figure 11A:
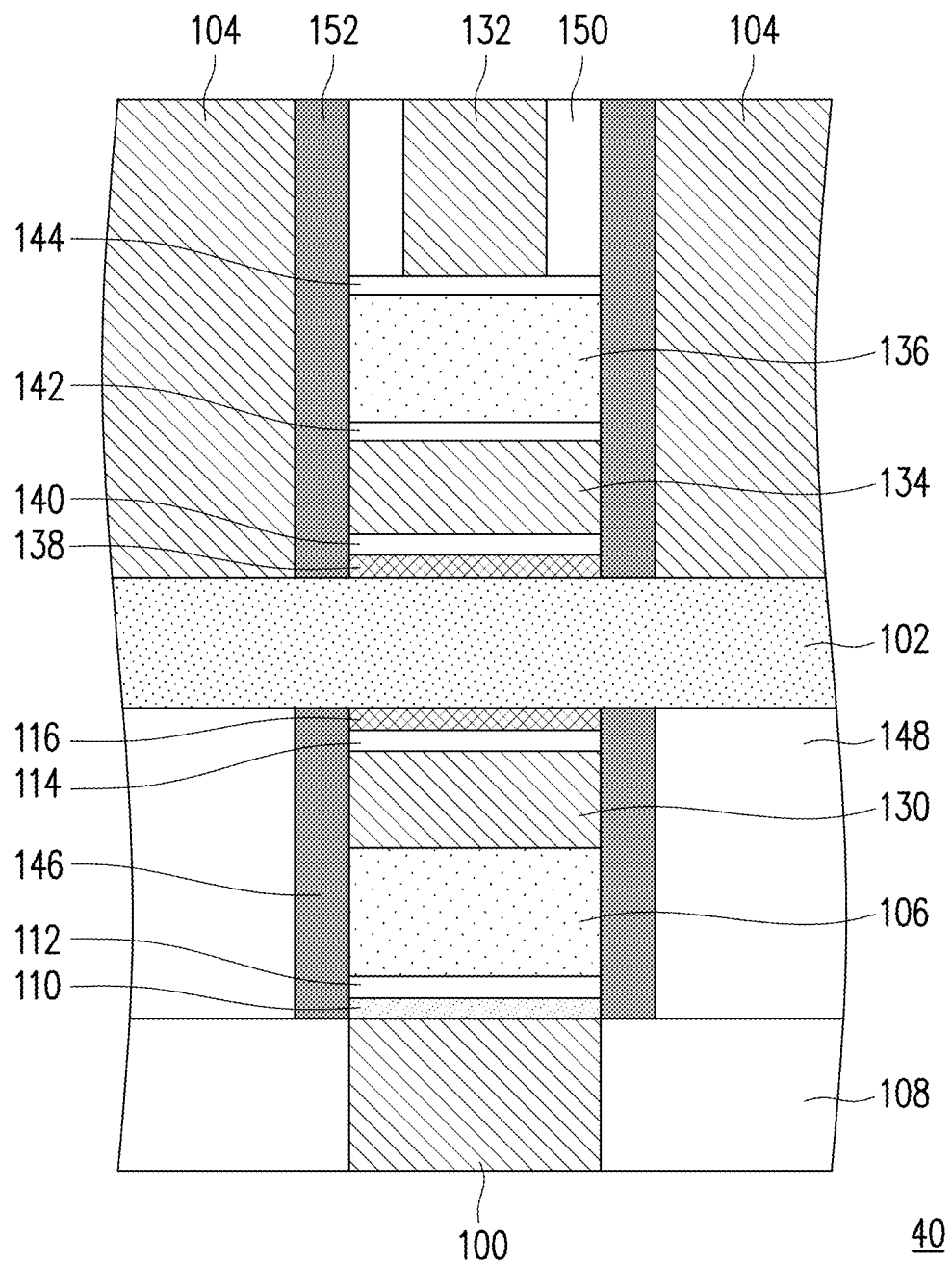
FIG. 11A is a schematic cross-sectional view illustrating a ferroelectric memory device, according to some embodiments of the present disclosure.
Figure 11B:
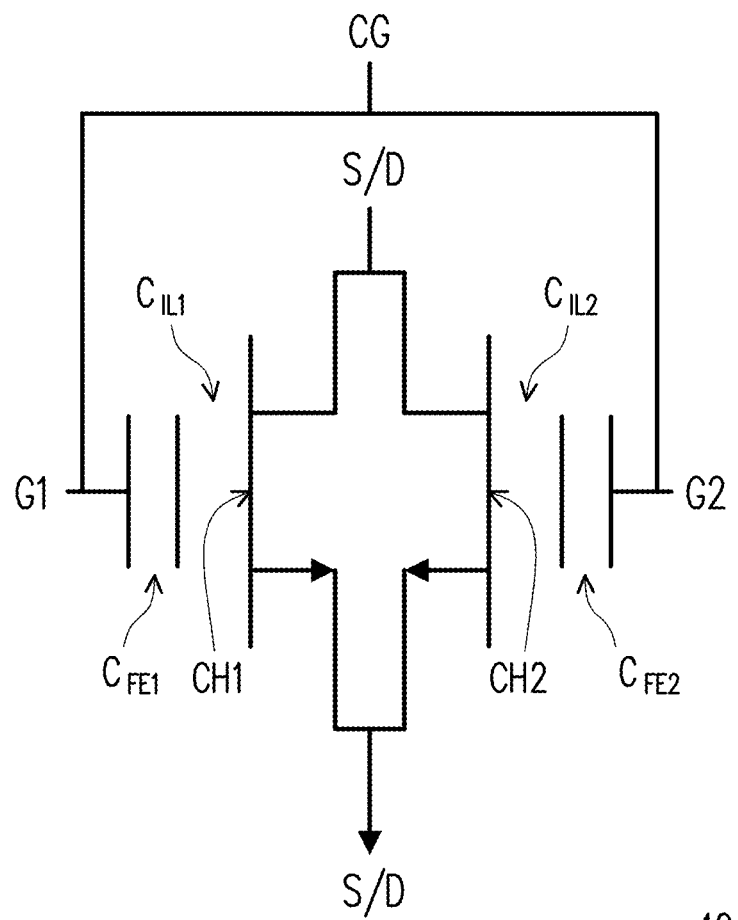
FIG. 11B is a circuit diagram of the ferroelectric memory device 40 as shown in FIG. 11A.

FIG. 11A is a schematic cross-sectional view illustrating a ferroelectric memory device 40, according to some embodiments of the present disclosure. FIG. 11B is a circuit diagram of the ferroelectric memory device 40 as shown in FIG. 11A. The ferroelectric memory device 40 is similar to the ferroelectric memory device 30 as described with reference to FIG. 10A. Only the differences between the ferroelectric memory devices 30, 40 will be described. The same or the like parts of the ferroelectric memory devices 30, 40 would not be repeated again.

Referring to FIG. 11A, the ferroelectric memory device 40 is a double gate MFMIS FET, and further includes a gate electrode 132 disposed over the channel layer 102, as well as a floating gate layer 134 and a ferroelectric layer 136 between the gate electrode 132 and the channel layer 102. The floating gate layer 134 is disposed between the ferroelectric layer 136 and the channel layer 102. In some embodiments, blocking layers 138, 140 are sandwiched between the channel layer 102 and the floating gate layer 134. In these embodiments, a gate capacitor between the floating gate layer 134 and the channel layer 102 is formed across the blocking layers 138, 140, and may be referred as a MIS capacitor. On the other hand, a gate capacitor between the floating gate layer 134 and the gate electrode 132 is formed across layers including the ferroelectric layer 136, and may be referred as a MFM capacitor or a ferroelectric capacitor. In this way, in addition to a MIS capacitor and a MFM capacitor formed at a bottom side of the channel layer 102, a MIS capacitor and a MFM capacitor are further formed at a top side of the channel layer 102. In addition, the MIS capacitor and the MFM capacitor between the channel layer 102 and the gate electrode 132 are connected in series.

The gate electrode 132 is similar to the gate electrode 100 in terms of material candidates, thickness range and formation method; the floating layer 134 is similar to the floating gate layer 130 in terms of material candidates, thickness range and formation method; the ferroelectric layer 136 is similar to the ferroelectric layer 106 in terms of material candidates, thickness range and formation method; the blocking layer 138 is similar to the blocking layer 116 in terms of material candidates, thickness range and formation method; and the blocking layer 140 is similar to the blocking layer 114 in terms of material candidates, thickness range and formation method. In some embodiments, the ferroelectric layer 136 is sandwiched between a seed layer 142 and a seed layer 144. The seed layers 142, 144 may respectively be similar to the seed layer 112 in terms of material candidates, thickness range and formation method.

In some embodiments, a stacking structure including the buffer layer 110, the seed layer 112, the ferroelectric layer 106, the floating gate layer 130 and the blocking layers 114, 116 is patterned, in order to isolate the ferroelectric memory device 40 from a possible ferroelectric memory device (not shown) disposed aside the ferroelectric memory device 40. In these embodiments, a sidewall spacer 146 and a dielectric layer 148 may laterally surround such stacking structure. The sidewall spacer 146 extends along a sidewall of such stacking structure, and is laterally surrounded by the dielectric layer 148. Similarly, a stacking structure including the blocking layers 138, 140, the floating gate layer 134, the buffer layer 142, the ferroelectric layer 136, the buffer layer 144 and a dielectric layer 150 laterally surrounding the gate electrode 132 is patterned, and a sidewall spacer 152 extends along a sidewall of such stacking structure. On the other hand, the channel layer 102 may be globally formed on the underlying structure, and the source/drain electrodes 104 may stand on the channel layer 102 and located at opposite sides of the stacking structure including the gate electrode 132. The source/drain electrodes 104 may be in lateral contact with such stacking structure through the sidewall spacer 152. The sidewall spacers 146, 152 and the dielectric layers 148, 150 may respectively be formed of an insulating material, the present disclosure is not limited to alternatives of the insulating material.

Referring to FIG. 11A and FIG. 11B, the gate electrodes 100, 132 may be functioned as gate terminals G1, G2 of the double gate MFMIS FET, and the source/drain electrodes 104 may be functioned as source/drain terminals S/D of the double gate MFMIS FET. Conduction channels CH1, CH2 extend between the source/drain terminals S/D and capacitively coupled to the gate terminals G1, G2, respectively. The conduction channels CH1, CH2 are established in the same channel layer 102, thus are depicted as being connected with each other. The MFM capacitor defined between the gate electrode 100 and the floating gate layer 130 is indicated by a gate capacitor $C_{FE1}$, and the MIS capacitor defined between the floating gate layer 130 and the channel layer 102 is indicated by a gate capacitor $C_{IL1}$. On the other hand, the MFM capacitor defined between the gate electrode 132 and the floating gate layer 134 is indicated by a gate capacitor $C_{FE2}$, and the MIS capacitor defined between the floating gate layer 134 and the channel layer 102 is indicated by a gate capacitor $C_{IL2}$. As shown in FIG. 11B, the gate capacitor $C_{FE1}$ and the gate capacitor $C_{IL1}$ are in serial connection between the gate terminal G1 and the conduction channel CH1, while the gate capacitor $C_{FE2}$ and the gate capacitor $C_{IL2}$ are in serial connection between the gate terminal G2 and the conduction channel CH2. In some embodiments, the gate terminal G1 is connected with the gate terminal G2. In these embodiments, the gate terminals G1, G2 may be controlled through a common gate control terminal CG.

Figure 12:
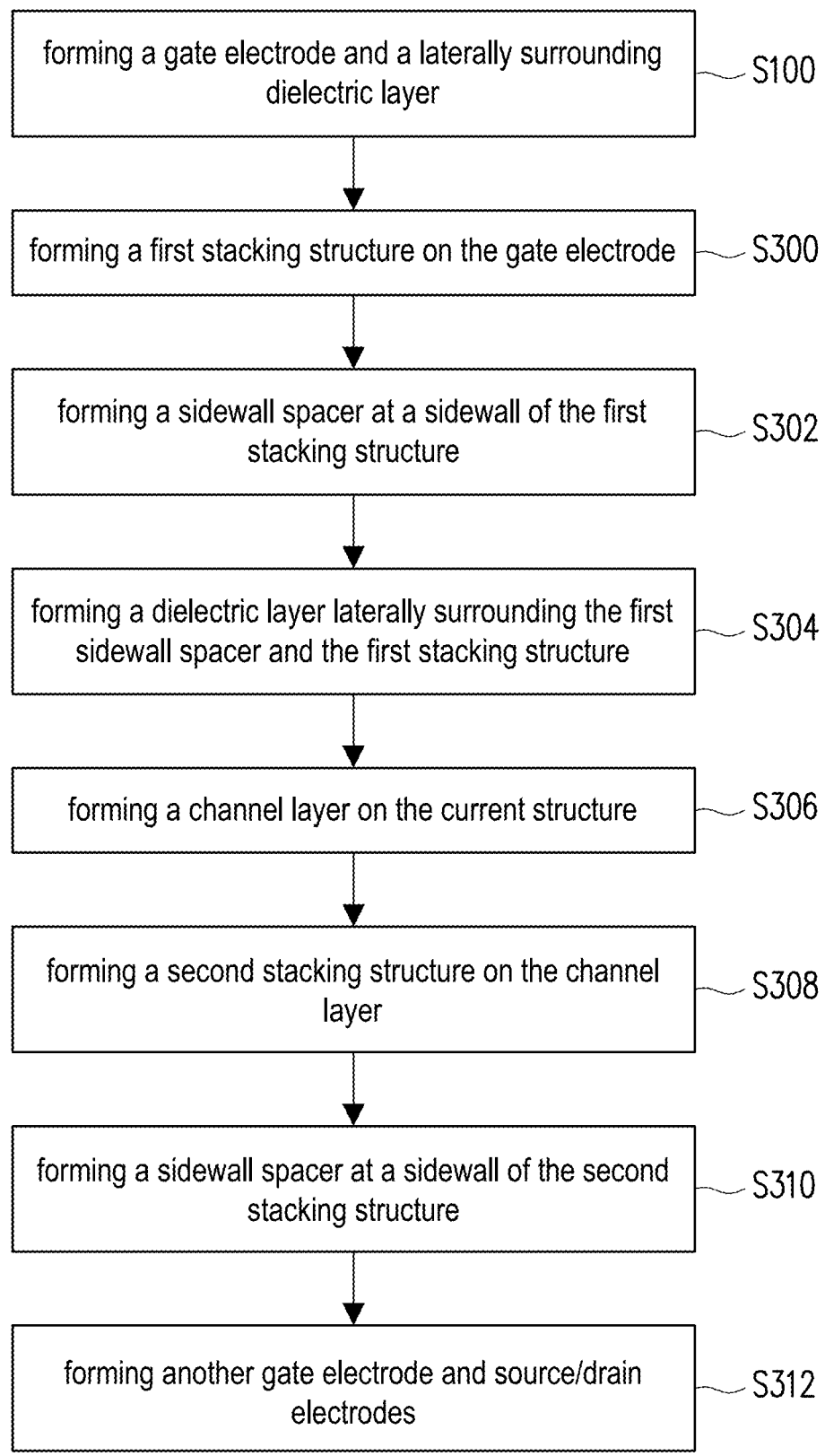
FIG. 12 is a flow diagram illustrating a method for forming the ferroelectric memory device as shown in FIG. 11A, according to some embodiments of the present disclosure.

FIG. 12 is a flow diagram illustrating a method for forming the ferroelectric memory device 40 as shown in FIG. 11A, according to some embodiments of the present disclosure. FIG. 13A through FIG. 13F are cross-sectional views illustrating intermediate structures during the manufacturing process as shown in FIG. 12.

Figure 13A:
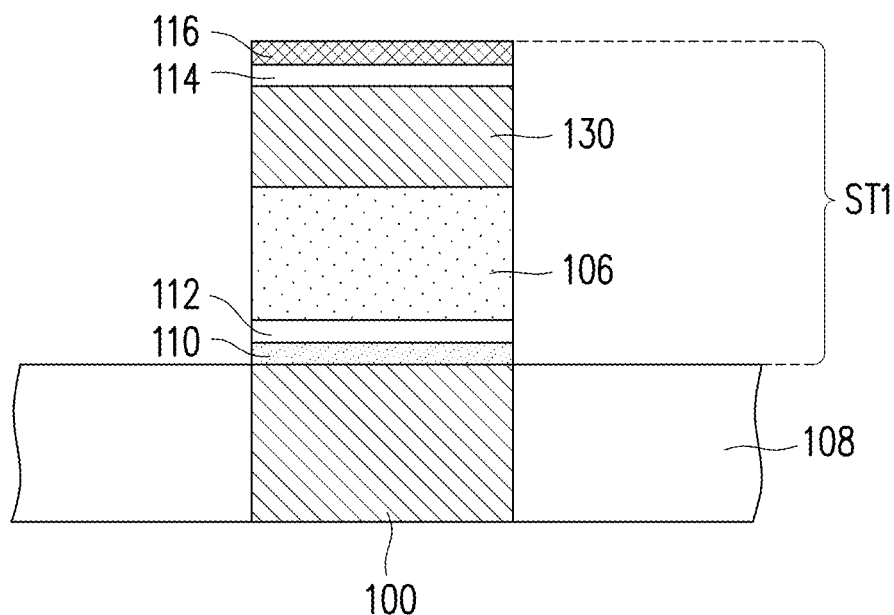
FIG. 13A through FIG. 13F are cross-sectional views illustrating intermediate structures during the manufacturing process as shown in FIG. 12.

Referring to FIG. 12 and FIG. 13A, step S100 as described with reference to FIG. 4 and FIG. 5A is initially performed. Subsequently, step S300 is performed, and a stacking structure ST1 including the buffer layer 110, the seed layer 112 the ferroelectric layer 106, the floating gate layer 130 and the blocking layers 114, 116 is formed on the gate electrode 100. In some embodiments, material layers are globally formed on the gate electrode 100 and the dielectric layer 108 at first, and then patterned to form the stacking structure ST1. Formation of these material layers has been described with reference to FIG. 2A, FIG. 2B, FIG. 3, FIG. 5A, FIG. 5B and FIG. 10A, thus would not be repeated again. In addition, such patterning may include a lithography process and at least one etching process.

Figure 13B:
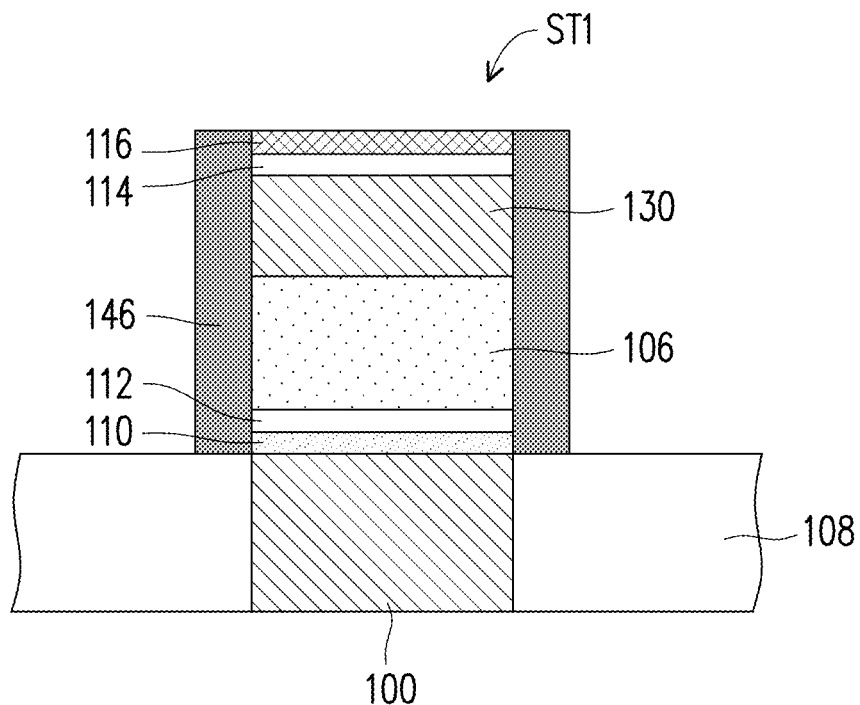

Referring to FIG. 12 and FIG. 13B, step S302 is performed, and the sidewall spacer 146 is formed at a sidewall of the stacking structure ST1. In some embodiments, a method for forming the sidewall spacer 146 includes forming an insulating layer conformally covering the structure as shown in FIG. 13A, and removing portions of the insulating layer extending along a top surface of the dielectric layer 108 and a top surface of the stacking structure ST1 by an etching process. The remained portion of the insulating layer may form the sidewall spacer 146.

Figure 13C:
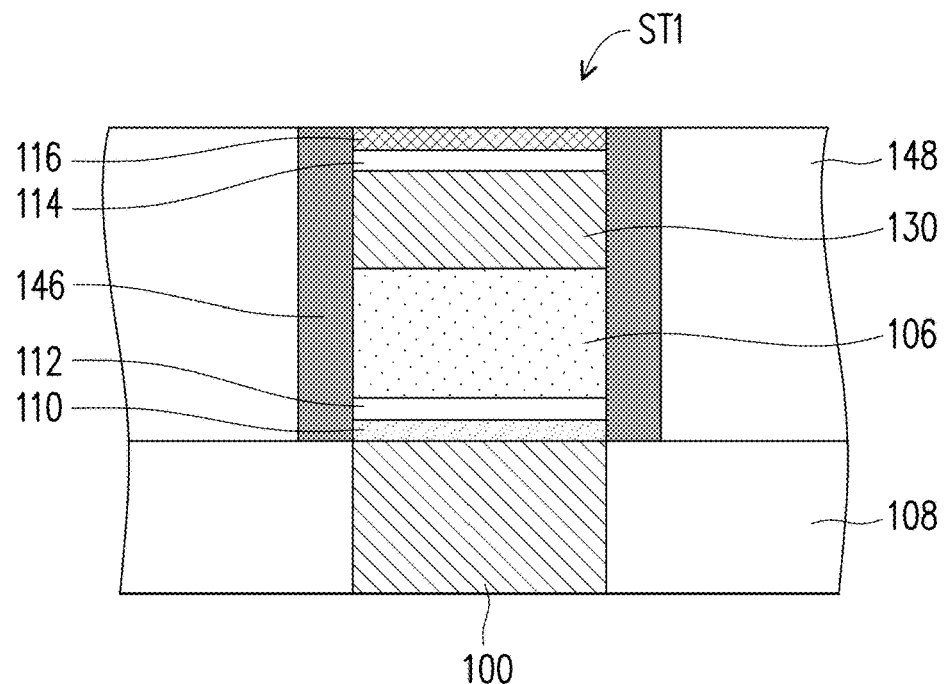

Referring to FIG. 12 and FIG. 13C, step S304 is performed, and the dielectric layer 148 is formed to laterally surround the sidewall spacer 146 and the stacking structure ST1. In some embodiments, a method for forming the dielectric layer 148 includes forming a dielectric layer globally covering the structure as shown in FIG. 13B, and removing portions of the dielectric layer over the stacking structure ST1 and the sidewall spacer 146 by a planarization process. The remained portions of the dielectric layer may form the dielectric layer 148. The planarization process may include, for example, a polishing process, an etching process or a combination thereof.

Figure 13D:
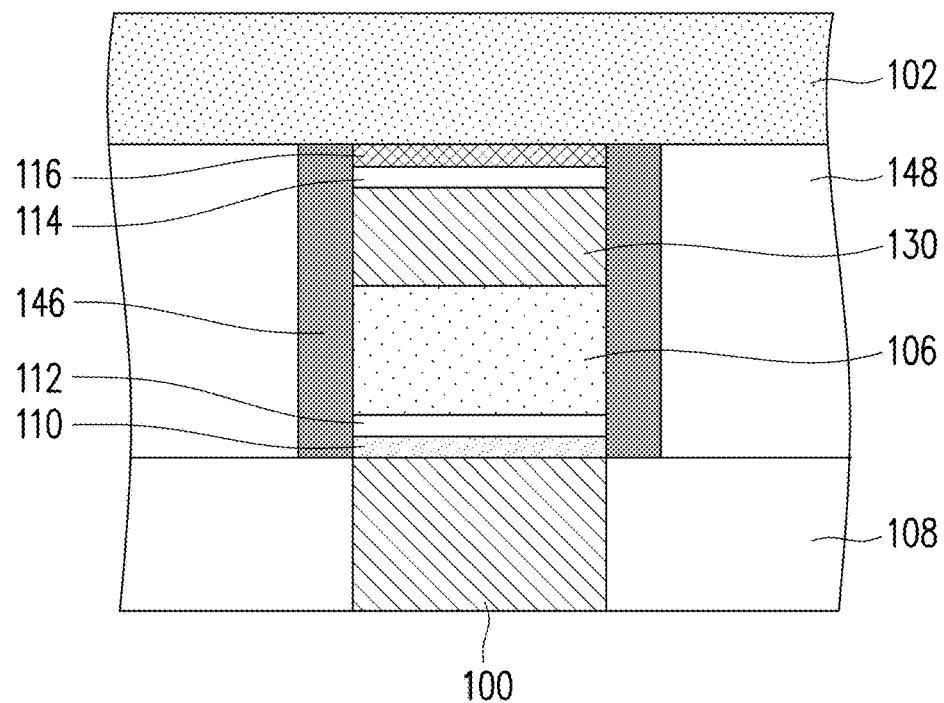

Referring to FIG. 12 and FIG. 13D, step S306 is performed, and the channel layer 102 is formed on the current structure. In some embodiments, the channel layer 102 is globally formed on the structure as shown in FIG. 13C. A method for forming the channel layer 102 may be referred to the method as described with reference to FIG. 5C, and would not be repeated again.

Figure 13E:
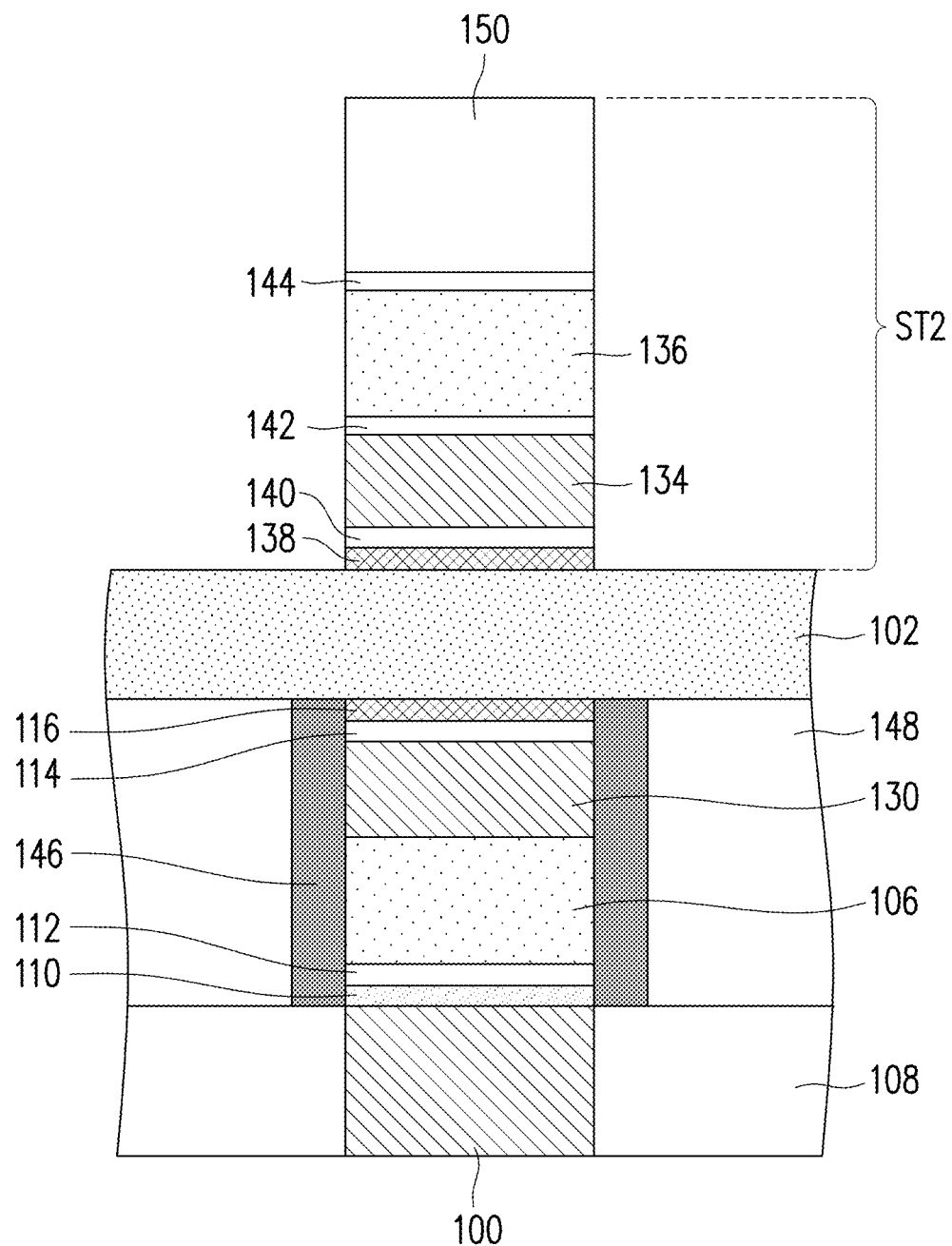

Referring to FIG. 12 and FIG. 13E, step S308 is performed, and a stacking structure ST2 including the blocking layers 138, 140, the floating gate layer 134, the seed layer 142, the ferroelectric layer 136, the seed layer 144 and the dielectric layer 150 is formed on the channel layer 102. In some embodiments, material layers are globally formed on the channel layer 102 at first, and then patterned to form the stacking structure ST2 by a lithography process and at least one etching process. Formation of the material layers for forming the blocking layers 138, 140 may be referred to the alternatives for forming the blocking layers 114, 116, as described with reference to FIG. 2A, FIG. 2B and FIG. 3. Formation of the material layer for forming the floating gate layer 134 may be referred to the alternatives for forming the floating gate layer 130, as described with reference to FIG. 10A. Formation of each of the material layers for forming the seed layers 142, 144 may be referred to the alternatives for forming the seed layer 112 as described with reference to FIG. 5A. Formation of the material layer for forming the ferroelectric layer 136 may be referred to alternatives for forming the ferroelectric layer 106, as described with reference to FIG. 5A. In addition, formation of the material layer for forming the dielectric layer 150 may include a deposition process, such as a CVD process.

Figure 13F:
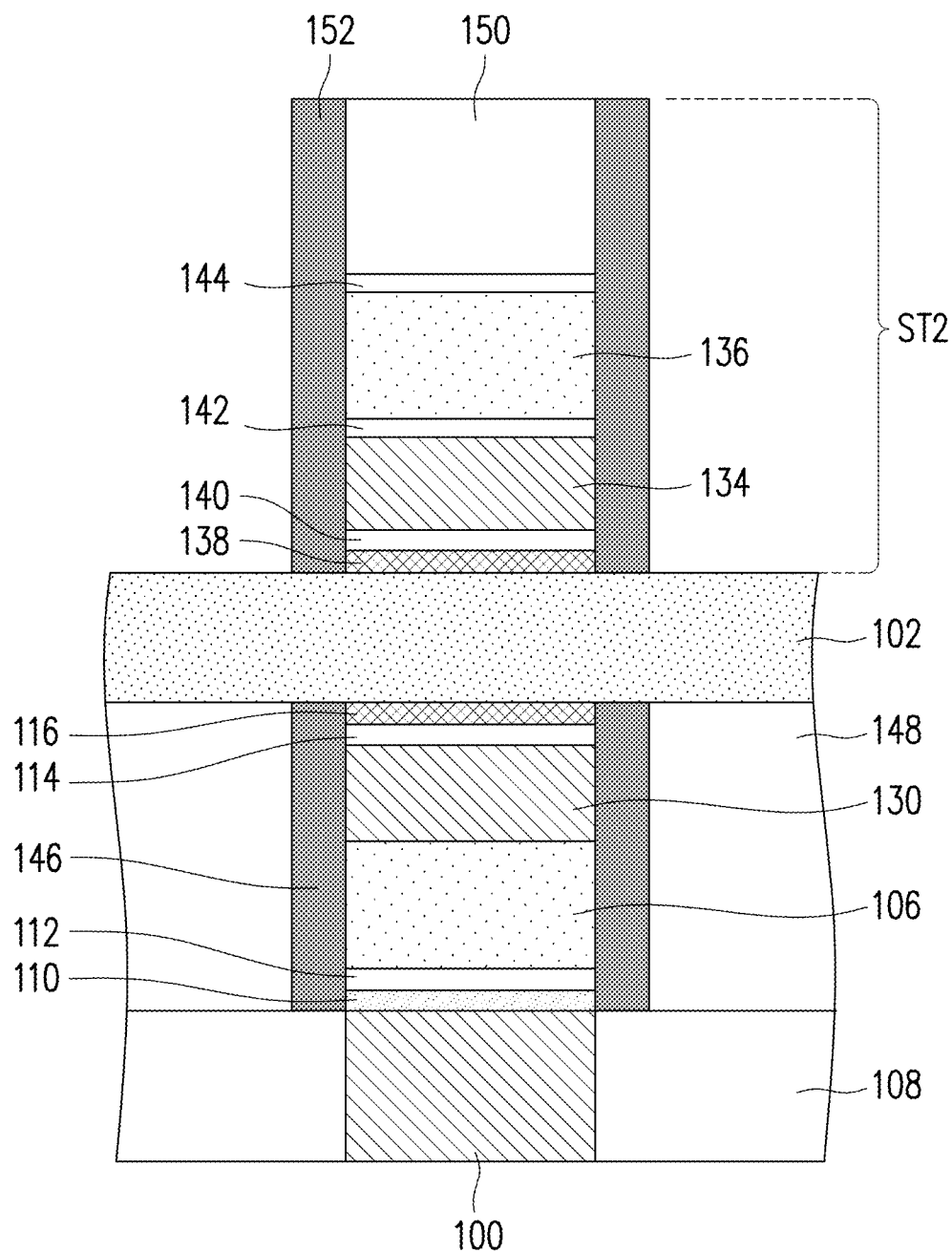

Referring to FIG. 12 and FIG. 13F, step S310 is performed, and the sidewall spacer 152 is formed at a sidewall of the stacking structure ST2. In some embodiments, a method for forming the sidewall spacer 152 includes forming an insulating layer conformally covering the structure as shown in FIG. 13E, and removing portions of the insulating layer extending along a top surface of the channel layer 102 and a top surface of the stacking structure ST2 by an etching process. The remained portion of the insulating layer may form the sidewall spacer 152.

Referring to FIG. 12 and FIG. 11A, step S312 is performed, and the gate electrode 132 as well as the source/drain electrodes 104 are formed. In some embodiments, a method for forming the gate electrode 132 and the source/drain electrodes 104 includes forming an opening in the dielectric layer 150 by a lithography process and an etching process, and filling a conductive material into the opening and a space aside the sidewall spacer 152 by a deposition process, a plating process or a combination thereof. A planarization process, such as a polishing process, an etching process or a combination thereof, is performed for removing portions of the conductive material above the stacking structure ST2. Remained portions of the conductive material may form the gate electrode 132 and the source/drain electrodes 104.

Up to here, the ferroelectric memory device 40 as shown in FIG. 11A has been formed. Subsequently, further BEOL process may be performed to connect the gate electrodes 100, 132 to a common gate terminal CG as described with reference to FIG. 11B, and to out rout the common gate terminal CG as well as the source/drain electrodes 104.

Moreover, variations described with reference to FIG. 6A and FIG. 6C may also be applied on the embodiments shown in FIG. 10A and FIG. 10B. That is, the blocking layer 114 may be omitted, and/or the blocking layer 116 may alternatively be formed by a bottom portion of the channel layer 102. Similarly, the blocking layer 140 may be omitted, and/or the blocking layer 138 may be formed by a top portion of the channel layer 102. In addition, as another alternative described with reference to FIG. 6D, an additional blocking layer may be further disposed between the ferroelectric layer 106 and the gate electrode 100, so as to passivate trap states near an interface defined between the ferroelectric layer 106 and the gate electrode 100. Similarly, an additional blocking layer may be further disposed between the ferroelectric layer 136 and the gate electrode 132, so as to passivate trap states near an interface defined between the ferroelectric layer 136 and the gate electrode 132.

Figure 14:
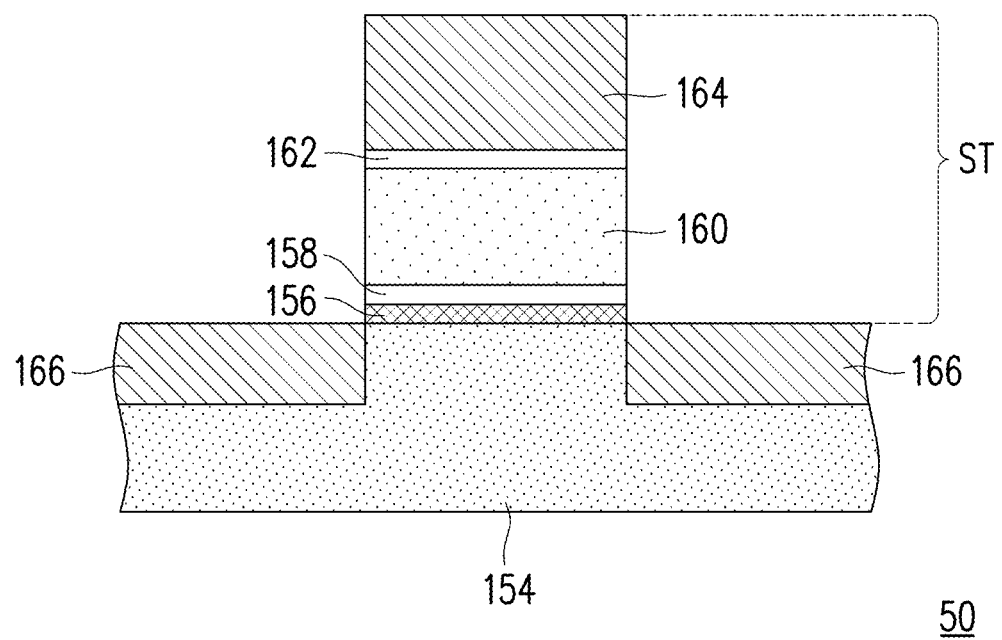
FIG. 14 is a schematic cross-sectional view illustrating a ferroelectric memory device, according to some embodiments of the present disclosure.

FIG. 14 is a schematic cross-sectional view illustrating a ferroelectric memory device 50, according to some embodiments of the present disclosure. The ferroelectric memory device 50 is similar to the ferroelectric memory device 10 as described with reference to FIG. 1A. Only the differences between the ferroelectric memory devices 10, 50 will be described. The same or the like parts of the ferroelectric memory devices 10, 50 would not be repeated again.

Referring to FIG. 14, the ferroelectric memory device 50 is a top gate ferroelectric FET. A stacking structure ST is disposed on a channel layer 154. The channel layer 154 may be a semiconductor wafer or a semiconductor-on-insulator (SOI) wafer. Alternatively, the channel layer 154 may be a semiconductor layer embedded in a BEOL structure over a semiconductor wafer or a SOI wafer, and may be similar to the channel layer 102 in terms of material candidates, thickness range and formation method described with reference to FIG. 1A and FIG. 5C. The stacking structure ST may include a blocking layer 156, a seed layer 158, a ferroelectric layer 160, a seed layer 162 and a gate electrode 164. The blocking layer 156 may be disposed between the seed layer 158 and the channel layer 154, and is configured to passivate trap states near an interface defined between the ferroelectric layer 160 and the channel layer 154. The blocking layer 156 is similar to the blocking layer 116 in terms of material candidates, thickness range and formation method, as described with reference to FIG. 1A, FIG. 2A, FIG. 2B and FIG. 3. The seed layers 158, 162 cover bottom and top surfaces of the ferroelectric layer 160, and are configured to enhance growth of a preferred crystalline phase (e.g., the O-phase) in the ferroelectric layer 160. The seed layers 158, 162 are each similar to the seed layer 112 in terms of material candidates, thickness range and formation method as described with reference to FIG. 1A and FIG. 5A. The ferroelectric layer 160, which is configured to store binary data as polarizations with different polarities, is similar to the ferroelectric layer 106 in terms of material candidates, thickness range and formation method described with reference to FIG. 1A and FIG. 5A. The gate electrode 164 is capacitively coupled to the channel layer 154 through layers including the ferroelectric layer 160, and is similar to the gate electrode 100 in terms of material candidates, thickness range and formation method, as described with reference to FIG. 1A and FIG. 5A. In some embodiments, the stacking structure ST is patterned, in order to isolate the ferroelectric memory device 50 from a possible ferroelectric memory device (not shown) aside the ferroelectric memory device 50.

Source/drain electrodes 166 are disposed at opposite sides of the stacking structure ST, and electrically connected to the channel layer 154. In some embodiments, the source/drain electrodes 166 are embedded into the channel layer 154. In these embodiments, the source/drain electrodes 166 may extend into the channel layer 154 from a top surface of the channel layer 154 by a depth, for example, ranging from 5 nm to 1000 nm. The source/drain electrodes 166 may be doping regions in the channel layer 154.

An equivalent circuit of the ferroelectric memory device 50 may be substantially identical with the equivalent circuit of the ferroelectric memory device 10 as shown in FIG. 1B. The gate electrode 164 may be functioned as the gate terminal G, and the source/drain electrodes 166 may be functioned as the source/drain terminals S/D. The conduction channel CH may be established in the channel layer 154. The gate capacitor $C_{FE}$ defined between the gate terminal G and the conduction channel CH may be formed across layers including the ferroelectric layer 160, and may be referred as a ferroelectric capacitor.

Figure 15:
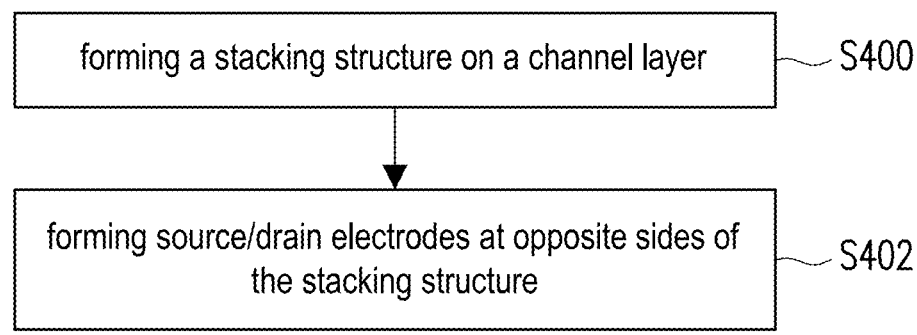
FIG. 15 is a flow diagram illustrating a method for forming the ferroelectric memory device as shown in FIG. 14, according to some embodiments of the present disclosure.
Figure 16:
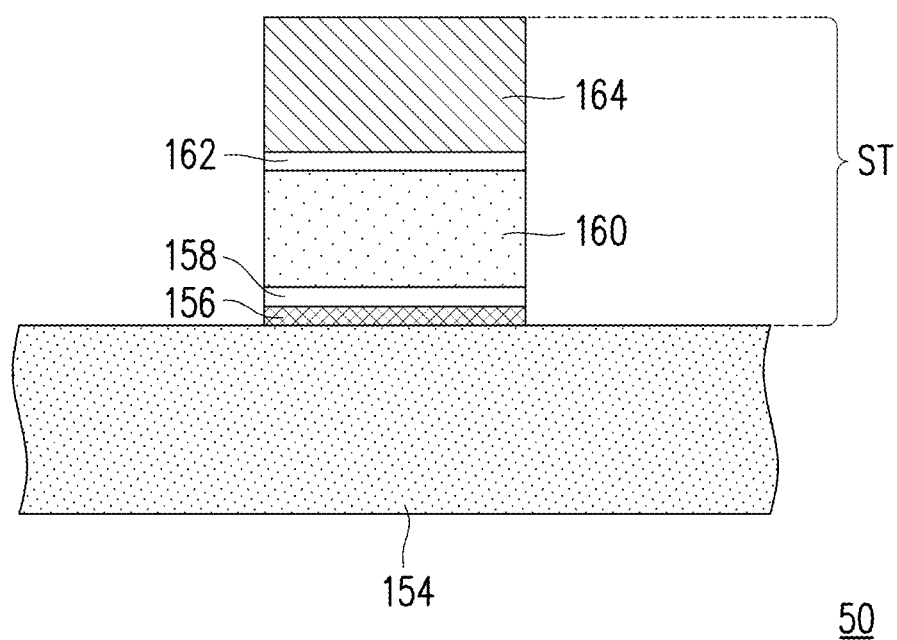
FIG. 16 is a cross-sectional view illustrating an intermediate structure during the manufacturing process as shown in FIG. 15.

FIG. 15 is a flow diagram illustrating a method for forming the ferroelectric memory device 50 as shown in FIG. 14, according to some embodiments of the present disclosure. FIG. 16 is a cross-sectional view illustrating an intermediate structure during the manufacturing process as shown in FIG. 15.

Referring to FIG. 15 and FIG. 16, step S400 is performed, and the stacking structure ST including the blocking layer 156, the seed layers 158, 162, the ferroelectric layer 160 and the gate electrode 164 is formed on the channel layer 154. In some embodiments, material layers are globally formed on the channel layer 154 at first, and then patterned to form the stacking structure ST by a lithography process and at least one etching process. Formation of the material layer for forming the blocking layer 156 may be referred to the alternatives for forming the blocking layer 116a as described with reference to FIG. 6A. Formation of the material layers for forming the seed layers 158, 162 may be referred to the alternatives for forming the seed layer 112, as described with reference to FIG. 5A. Formation of the material layer for forming the ferroelectric layer 160 may be referred to the alternatives for forming the ferroelectric layer 106, as described with reference to FIG. 5A. In addition, a method for forming the material layer to be patterned to form the gate electrode 164 may include a deposition process, a plating process or a combination thereof.

Referring to FIG. 15 and FIG. 14, step S402 is performed, and the source/drain electrodes 166 are formed. In those embodiments where the source/drain electrodes 166 are embedded into the channel layer 154, a method for forming the source/drain electrodes 166 may include performing an ion implantation process on the channel layer 154. During the ion implantation process, the stacking structure ST may be functioned as a shadow mask.

Up to here, the ferroelectric memory device 50 shown in FIG. 14 has been formed. Subsequently, further BEOL process may be performed to out rout the gate electrode 164 as well as the source/drain electrodes 166, and to complete formation of the BEOL structure. Moreover, a blocking layer similar to the blocking layer 114 as described with reference to FIG. 1A may be further inserted between the blocking layer 156 and the seed layer 158. In addition, as another alternative described with reference to FIG. 6D, an additional blocking layer may be further disposed between the ferroelectric layer 160 and the gate electrode 164, in order to passivate trap states near an interface defined between the ferroelectric layer 160 and the gate electrode 164.

Figure 17:
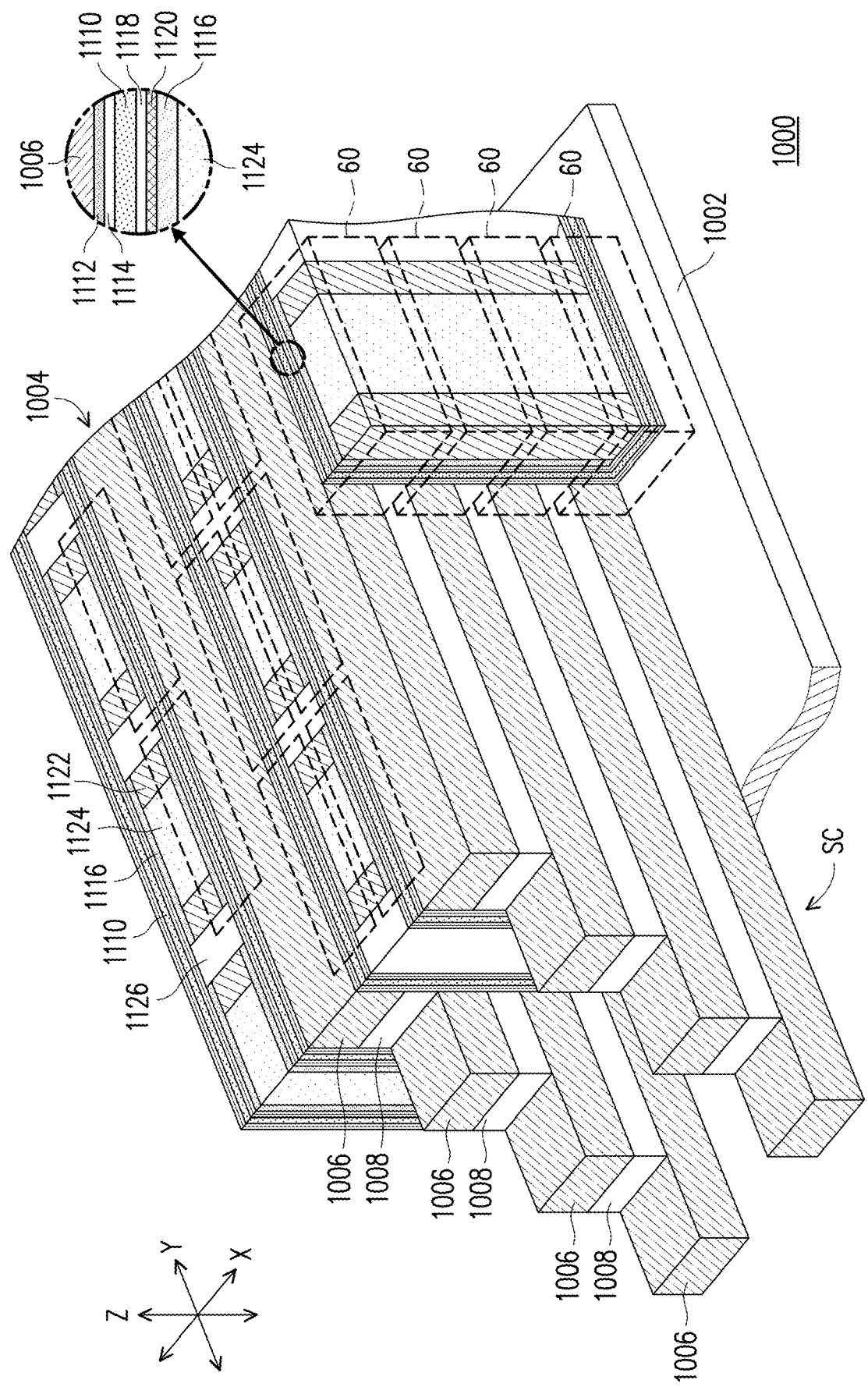
FIG. 17 is a schematic three-dimensional view illustrating a memory array, according to some embodiments of the present disclosure.

FIG. 17 is a schematic three-dimensional view illustrating a memory array 1000, according to some embodiments of the present disclosure.

Referring to FIG. 17, the memory array 1000 is a three-dimensional memory array, and includes stacks of ferroelectric memory devices 60 formed on a substrate 1002. In some embodiments, the substrate 1002 is an etching stop layer over a semiconductor substrate (not shown), such as a semiconductor wafer or a SOI wafer. In these embodiments, active devices (e.g., transistors) and interconnections of these active devices (both not shown) may be formed on the semiconductor wafer (or the SOI wafer) and lying below the substrate 1002. In alternative embodiments, the substrate 1002 is the semiconductor wafer or the SOI wafer.

The stacks of ferroelectric memory devices 60 are arranged in columns respectively extending along a direction Y (also referred as a column direction). These columns are arranged along a direction X (also referred as a row direction) intersected with the direction Y. In order to clearly illustrate elements in each stack of the ferroelectric memory devices 60, a stack of the ferroelectric memory devices 60 in one of these columns are particularly depicted as solely standing on the substrate 1002. Although not shown, there are actually other stacks of the ferroelectric memory devices 60 in this column. As shown in FIG. 17, each stack of the ferroelectric memory devices 60 contain a segment of a stacking structure 1004 formed on the substrate 1002. A plurality of the stacking structures 1004 extend along the column direction (i.e., the direction Y), and are laterally spaced apart from one another along the row direction (i.e., the direction X). The stacks of the ferroelectric memory devices 60 in the same column share the same stacking structure 1004, and each stacking structure 1004 may be shared by the stacks of the ferroelectric memory devices 60 in adjacent columns.

Word lines 1006 and isolation layers 1008 are alternately stacked along a vertical direction Z in each stacking structure 1004. A topmost layer in the stacking structure 1004 may be one of the word lines 1006 or one of the isolation layers 1008. Similarly, a bottommost layer in the stacking structure 1004 may be one of the word lines 1006 or one of the isolation layers 1008. Further, those skilled in the art may adjust the amount of the word lines 1006 and the isolation layers 1008 in each stacking structure 1004, the present disclosure is not limited thereto. The word lines 1006 may be formed of a conductive material, while the isolation layers 1008 may be formed of an insulating material. Candidates of the conductive material for forming the word lines 1006 may be referred to the candidates of the conductive material for forming the gate electrode 100, as described with reference to FIG. 1A. In addition, the insulating material may include, for example, silicon oxide, silicon nitride, silicon oxynitride or the like.

Ferroelectric layers 1110, which are respectively similar to the ferroelectric layer 106 in terms of material candidates, thickness range and formation method as described with reference to FIG. 1A and FIG. 5A, span along sidewalls of the stacking structures 1004. In some embodiments, each ferroelectric layer 1110 covers opposing sidewalls of adjacent stacking structures 1004, and extends along a portion of the substrate 1000 between these adjacent stacking structures 1004. In other words, a sidewall and a bottom surface of each trench between adjacent stacking structures 1004 may be covered by one of the ferroelectric layers 1110. In alternative embodiments, the ferroelectric layers 1110 respectively cover a sidewall of one of the stacking structures 1004, and are separated from one another.

A buffer layer 1112 and a seed layer 1114, which are similar to the buffer layer 110 and the seed layer 112 in terms of material candidates, thickness range and formation method as described with reference to FIG. 1A and FIG. 5A, are sandwiched between each ferroelectric layer 1110 and the covered stacking structure(s) 1004. The seed layers 1114 may span between the buffer layers 1112 and the ferroelectric layers 1110. The buffer layers 1112 are configured to provide a growth template with less lattice mismatch for the ferroelectric layers 1110, and the seed layers 1114 are configured to enhance growth of a preferred crystalline phase (e.g., the O-phase) in the ferroelectric layers 1110. In some embodiments, the buffer layers 1112 and the seed layers 1114 respectively have a pattern/shape substantially identical with a pattern/shape of each ferroelectric layer 1110. In these embodiments, the ferroelectric layers 110 may be entirely overlapped with the buffer layers 1112 and the seed layers 1114.

Channel layers 1116, which are respectively similar to the channel layer 102 in terms of material candidates, thickness range and formation method as described with reference to FIG. 1A and FIG. 5C, cover surfaces of the ferroelectric layers 1110 facing toward trenches between the stacking structures 1004. In some embodiments, opposite sidewalls of each stacking structure 1004 are respectively covered by laterally separated ones of the channel layers 1116, such that each channel layer 1116 may be exclusively shared by a stack of the ferroelectric memory devices 60. In these embodiments, cross-talk between adjacent stacks of the ferroelectric memory devices 60 arranged along the direction Y may be reduced. In addition, in some embodiments, the channel layers 1116 at opposing sidewalls of adjacent stacking structures 1004 are laterally spaced apart. In alternative embodiments, the channel layers 116 covering opposing sidewalls of each trench between adjacent stacking structures 1004 are connected with each other by a bottom portions extending along a portion of the substrate 1002 between the adjacent stacking structures 1004.

A blocking layer 1118 and a blocking layer 1120 are sandwiched between each of the channel layers 1116 and one of the ferroelectric layers 1110. The blocking layers 1118 are respectively similar to the blocking layer 114 in terms of material candidates, thickness range and formation method as described with reference to FIG. 1A, FIG. 2A, FIG. 2B and FIG. 3. The blocking layers 118 are in contact with the ferroelectric layers 1110, and configured to increase potential barrier between the ferroelectric layers 1110 and the channel layers 1116 for reducing leakage current entering the ferroelectric layers 1110 from the channel layers 1116. On the other hand, the blocking layers 1120 are respectively similar to the blocking layer 116 in terms of material candidates, thickness range and formation method as described with reference to FIG. 1A, FIG. 2A, FIG. 2B and FIG. 3. The blocking layers 1120 are in contact with the channel layers 1116, and configured to reduce the leakage current and to passivate trap states near each interface defined between one of the ferroelectric layers 1110 and one of the channel layers 1116. In some embodiments, the blocking layers 1118, 1120 respectively have a pattern/shape substantially identical with a pattern/shape of each ferroelectric layer 110. In these embodiments, the ferroelectric layers 1110 may be entirely overlapped with the blocking layers 1118, 1120. In alternative embodiments, the blocking layers 1118, 1120 respectively have a pattern/shape substantially identical with a pattern/shape of each channel layer 1116. In these alternative embodiments, the blocking layers 1118, 1120 may be entirely overlapped with the channel layers 1116.

Moreover, variations of the blocking layers as described with reference to FIG. 6A through FIG. 6C may also be applied on the blocking layers 1118, 1120 as shown in FIG. 17. That is, the blocking layers 1118 may be omitted, and/or each blocking layer 1120 may alternatively be formed by a portion of a ferroelectric layer 1110 or a portion of a channel layer 1116. In addition, as another alternative described with reference to FIG. 6D, additional ferroelectric layers may be further disposed between the stacking structures 1004 and the ferroelectric layer 1110, in order to passivate trap states near each interface defined between a word line 1006 and a ferroelectric layer 1110. For instance, these additional blocking layers may be formed between the stacking structures 1004 and the buffer layers 1112.

Pairs of source/drain electrodes 1122 stand on the portions of the substrate 100 between the stacking structures 1004. The source/drain electrodes 1122 are similar to the source/drain electrodes 104 in terms of material candidates and formation method as described with reference to FIG. 1A, except that the source/drain electrodes 1122 may be respectively formed in a pillar shape. The source/drain electrodes 1122 in each pair are separately in lateral contact with the channel layer(s) 1116 covering opposing sidewalls of adjacent stacking structures 1004. Further, adjacent pairs of the source/drain electrodes 1122 arranged along the direction Y are laterally separated as well. In some embodiments, isolation structures 1124 are respectively filled between the conductive pillars 1122 of each pair, so as to isolate the source/drain electrodes 1122 of each pair from one another. In addition, in some embodiments, isolation pillars 1126 respectively stand between adjacent pairs of the source/drain electrodes 1122 in the same trench. In these embodiments, channel layers 1116 disposed along a sidewall of one of the stacking structures 1004 are separated from one another by the isolation pillars 1126 standing aside this stacking structure 1004. The isolation structures 1124 and the isolation pillars 1126 may be formed of the same or different insulating material(s). For instance, the insulating material(s) may include silicon oxide, silicon nitride, silicon oxynitride, silicon carbide, silicon carbo-nitride, silicon carbo-oxide, the like or combinations thereof. Moreover, in some embodiments, pairs of the source/drain electrodes 1122 at a side of a stacking structure 1004 are offset along the direction Y from pairs of the source/drain electrodes 1122 at the other side of the stacking structure 1004. In these embodiments, the stacks of ferroelectric memory devices 60 may be referred as being arranged in a staggered configuration.

A segment of one of the word lines 1006 and portions of the buffer layer 1112, the seed layer 1114, the ferroelectric layer 1110, the blocking layers 1118, 1120, the channel layer 1116 and a pair of source/drain electrodes 1122 in lateral contact with the segment of the word line 1006 collectively form one of the ferroelectric memory devices 60, which may be a ferroelectric FET. The segment of the word line 1006 is functioned as a gate terminal of the ferroelectric FET, and the pair of the source/drain electrodes 1122 are functioned as source and drain terminals of the ferroelectric FET. When the ferroelectric FET is turned on, a conduction channel may be formed in the portion of the channel layer 1116, and extend between the pair of the source/drain electrodes 1122. On the other hand, when the ferroelectric FET is in an off state, the conduction channel may be cut off or absent. During a programming operation, a dipole moment is stored in the ferroelectric layer 1100 due to ferroelectric polarization. On the other hand, during an erasing operation, a dipole moment reversal may be observed in the ferroelectric layer 1100. By storing the dipole moments with opposite directions or inserting/removing charges, the ferroelectric FET may have a relatively high threshold voltage and a relatively low threshold voltage, thus a high logic state and a low logic state can be stored in the ferroelectric FET. Accordingly, the field effect transistor is capable of storing data.

Furthermore, as described with reference to FIG. 10A, floating gate layers may be further inserted between the channel layers 1116 and the ferroelectric layers 1110, to form MFMIS FETs. The floating gate layers are capacitively coupled to the word lines 1006 through layers including the ferroelectric layers 1110, and are capacitively coupled to the channel layers 1116 through layers including the blocking layers 1120 (or the blocking layers 1118, 1120).

As shown in FIG. 17, the ferroelectric memory devices 60 in the same stack may share the same ferroelectric layer 1100, the same channel layer 1116, and the same pair of the conductive pillars 1122, while being controlled by different word lines 1006 in the same stacking structure 1004. Adjacent stacks of the ferroelectric memory devices 60 at opposite sides of a pair of the conductive pillars 1122 may share this pair of the conductive pillars 1122, while having different channel layers 1116 and being controlled by word lines 1006 in adjacent ones of the stacking structures 1004. Adjacent stacks of the ferroelectric memory devices 60 at opposite sides of the same stacking structure 1004 may share the word lines 1006 in this stacking structure 1004, while having different switching layers 1110, different channel layers 1116 and different pairs of the conductive pillars 1122. In addition, adjacent stacks of the ferroelectric memory devices 60 in the same column may share the same ferroelectric layer 1110 and the word lines 1006 in the same stacking structure 1004, while having different channel layers 1116 and different pairs of the conductive pillars 1122.

In some embodiments, end portions of the stacking structures 1004 are shaped into staircase structures SC, and the word lines 1006 extend to steps of the staircase structures SC.

An end portion of each word line 1006 in a stacking structure 1004 (except for the topmost word line 1006) laterally protrudes with respect to an end portion of an overlying word line 1006 in the same stacking structure 1004 along the column direction (i.e., the direction Y), to form a step of the staircase structure SC. In this way, each of the word lines 1006 may have an end portion not covered by others of the word lines 1006, thus can be independently out-routed. In some embodiments, an end portion of each isolation layer 1008 in a stacking structure 1004 is aligned with an end portion of an overlying word line 1006, and defines a bottom portion of a step. In these embodiments, each step of a staircase structure SC consists of end portions of one of the word lines 1006 and an underlying isolation layer 1008. It should be noted that, FIG. 17 merely shows the staircase structures SC at a single side of the memory array 1000. However, opposite sides of each stacking structure 1004 may be respectively shaped into a staircase structure SC.

Figure 18:
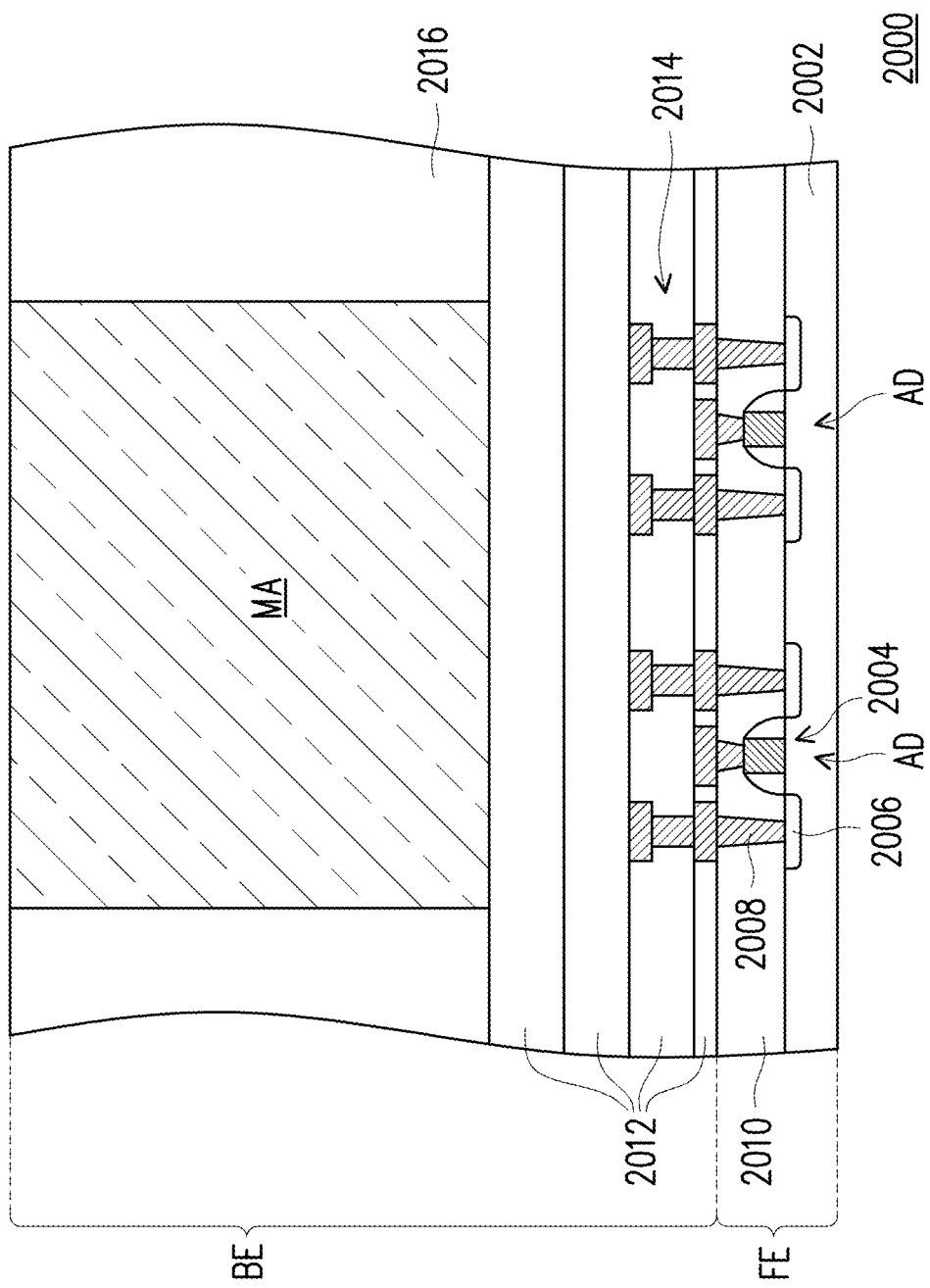
FIG. 18 is a cross-sectional view illustrating a portion of a semiconductor chip, according to some embodiments of the present disclosure.

FIG. 18 is a cross-sectional view illustrating a portion of a semiconductor chip 2000 according to some embodiments of the present disclosure.

Referring to FIG. 18, as described above, a memory array MA including a plurality of ferroelectric memory devices may be embedded in a BEOL structure BE of a semiconductor chip 2000. The memory array MA may be the three-dimensional memory array 1000 as described with reference to FIG. 17, or may be a two-dimensional memory array including a plurality of the ferroelectric memory devices described with reference to FIG. 1A, FIG. 6A, FIG. 6B, FIG. 6C, FIG. 6D, FIG. 7A, FIG. 10A, FIG. 11A or FIG. 14 and arranged at the same horizontal level. The BEOL structure BE is formed on a FEOL structure FE, and includes conductive elements electrically connected to active devices in the FEOL structure FE. In some embodiments, the FEOL structure FE is formed on a surface region of a semiconductor substrate 2002. For instance, the semiconductor substrate 2002 may be a semiconductor wafer or a SOI wafer. The FEOL structure FE may include active devices AD. For conciseness, only two of the active devices AD are depicted. The active devices AD, such as metal-oxide-semiconductor (MOS) FETs, may respectively include a gate structure 2004 and source/drain structures 2006 at opposite sides of the gate structure 2004. In some embodiments, the gate structure 2004 is disposed on a substantially flat surface of the semiconductor substrate 2002, and the source/drain structures 2006 at opposite sides of the gate structure 2004 are formed in shallow regions of the semiconductor substrate 2002. In these embodiments, the active device AD may be referred as a planar-type MOSFET, and a conduction channel may be established in a skin portion of the semiconductor substrate 2002 covered by the gate structure 2004 and extending between the source/drain structures 2006. In alternative embodiments, the active device AD is formed as a fin-type FET (or referred as finFET) or a gate-all-around (GAA) FET. In these alternative embodiments, conduction channels of these FETs may be established in three-dimensional active structures intersected with and covered by gate structures. Further, the FEOL structure FE may include contact plugs 2008 standing on the gate structures 2004 and the source/drain structures 2006, as well as a dielectric layer 2010 laterally surrounding the gate structure 2004 and the contact plugs 2008.

The BEOL structure BE may include a stack of dielectric layers 2012, and include conductive elements 2014 formed in the stack of dielectric layers 2012. The conductive elements 2014 are electrically connected to the active devices AD in the FEOL structure FE, and may also be referred as interconnections. The conductive elements 2014 may include conductive traces and conductive vias. The conductive traces respectively extend on one of the dielectric layers 2012, whereas the conductive vias respectively penetrate through one or more of the dielectric layers 2012, and establish electrical contact with one or more of the conductive traces. The memory array MA may be disposed on the stack of the dielectric layers 2012, and terminals of the ferroelectric memory devices in the memory array MA are routed to the underlying conductive elements 2014. Accordingly, the memory array MA can be routed to the active devices AD, and can be driven by these active devices AD. In some embodiments, the memory array MA may be laterally surrounded by at least one dielectric layer 2016. Further, more dielectric layer(s) and conductive elements (both not shown) may be formed on the dielectric layer 2016 and the memory array MA.

As above, the ferroelectric memory device according to embodiments of the present disclosure may be a ferroelectric FET. A first blocking layer and a second blocking layer are disposed between a channel layer and a ferroelectric layer in the ferroelectric FET. The second blocking layer is disposed between the channel layer and the first blocking layer. The first and second blocking layers may both include a material for creating a band offset at an interface defined between the channel layer and the ferroelectric layer. Accordingly, a potential barrier between the channel layer and the ferroelectric layer can be increased, and leakage current flowing between the ferroelectric layer and the channel layer can be reduced. Further, the second blocking layer is further incorporated with elements (e.g., nitrogen) for passivating trap states near an interface defined between the channel layer and the ferroelectric layer. By passivating these trap states, carriers traveling along a conduction channel established in the channel layer may be less scattered by the trap states, thus a subthreshold swing of the ferroelectric FET can be lowered. In addition, $I_{on}/I_{off}$ and field effect mobility of the ferroelectric FET can be increased. Further, NBTI and PBTI of the ferroelectric FET can be improved. The ferroelectric memory device may be formed with various configurations, and a memory array including a plurality of the ferroelectric memory devices may be a two-dimensional memory array or a three-dimensional memory array.

In an aspect of the present disclosure, a ferroelectric memory device is provided. The ferroelectric memory device comprises: a gate electrode; a ferroelectric layer, disposed at a side of the gate electrode; a channel layer, capacitively coupled to the gate electrode through the ferroelectric layer; a first blocking layer and a second blocking layer, disposed between the ferroelectric layer and the channel layer, wherein the second blocking layer is disposed between the first blocking layer and the channel layer, the first and second blocking layers comprise a same material, and the second blocking layer is further incorporated with nitrogen; and source/drain electrodes, disposed at opposite sides of the gate electrode, and electrically connected to the channel layer.

In another aspect of the present disclosure, a ferroelectric memory device is provided. The ferroelectric memory device comprises: a gate electrode; a channel layer, disposed at a side of the gate electrode; a ferroelectric layer, extending between the gate electrode and the channel layer; a blocking layer, sandwiched between the ferroelectric layer and the channel layer, wherein the blocking layer and the channel layer comprise a same material and the blocking layer is further incorporated with nitrogen, or the blocking layer and the ferroelectric layer comprise a same material and the blocking layer is further incorporated with nitrogen; and source/drain electrodes, disposed at opposite sides of the gate electrode, and electrically connected to the channel layer.

In yet another aspect of the present disclosure, a semiconductor chip is provided. The semiconductor chip comprises: a semiconductor substrate; active devices, formed on the semiconductor substrate; interconnections, extending over the active devices and electrically connected to the active devices; a memory array, disposed over the interconnections, and comprising ferroelectric memory devices. The ferroelectric memory devices respectively comprise: a gate electrode; a ferroelectric layer, disposed at a side of the gate electrode; a channel layer, capacitively coupled to the gate electrode through the ferroelectric layer; a first blocking layer and a second blocking layer, disposed between the ferroelectric layer and the channel layer, wherein the first and second blocking layers comprise a same material, and the second blocking layer is further incorporated with nitrogen; and source/drain electrodes, disposed at opposite sides of the gate electrode, and electrically connected to the channel layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A ferroelectric memory device, comprising:
    a gate electrode;
    a ferroelectric layer, disposed at a side of the gate electrode;
    a channel layer, capacitively coupled to the gate electrode through the ferroelectric layer;
    a first blocking layer and a second blocking layer, disposed between the ferroelectric layer and the channel layer, wherein the second blocking layer is disposed between the first blocking layer and the channel layer, the first and second blocking layers comprise a same material, and the second blocking layer is further incorporated with nitrogen; and
    source/drain electrodes, disposed at opposite sides of the gate electrode, and electrically connected to the channel layer.

2. The ferroelectric memory device according to claim 1, wherein the same material contained in the first and second blocking layers results in band offset at an interface of the channel layer and the first and second blocking layers.

3. The ferroelectric memory device according to claim 1, wherein the same material contained in the first and second blocking layers comprises an oxide ferroelectric material.

4. The ferroelectric memory device according to claim 1, wherein the same material contained in the first and second blocking layers is doped with at least one material having a bandgap higher than a bandgap of a material of the channel layer.

5. The ferroelectric memory device according to claim 1, wherein the first and second blocking layers both comprise hafnium oxide, and the second blocking layer is further incorporated with nitrogen.

6. The ferroelectric memory device according to claim 1, further comprising:
    a buffer layer and a seed layer, lining between the ferroelectric layer and the gate electrode, wherein the buffer layer is arranged to reduce lattice mismatch at an interface defined between the ferroelectric layer and the gate electrode, and the seed layer is arranged to enhance an orthorhombic crystalline phase fraction in the ferroelectric layer.

7. The ferroelectric memory device according to claim 1, further comprising:
    a third blocking layer, extending between the ferroelectric layer and the gate electrode, and formed of a material incorporated with nitrogen.

8. The ferroelectric memory device according to claim 1, further comprising:
    an additional gate electrode, disposed at a side of the channel layer facing away from the first and second blocking layers, and located between the source/drain electrodes; and
    an additional ferroelectric layer, extending between the additional gate electrode and the channel layer, wherein the source/drain electrodes penetrate through the additional ferroelectric layer to establish contact with the channel layer.

9. The ferroelectric memory device according to claim 8, further comprising:
    a fourth and a fifth blocking layers, sandwiched between the channel layer and the additional ferroelectric layer, and penetrated by the source/drain electrodes, wherein the fourth and fifth blocking layers comprise a same material, and the fifth blocking layer is further incorporated with nitrogen.

10. The ferroelectric memory device according to claim 9, wherein the fifth blocking layer is disposed between the channel layer and the fourth blocking layer.

11. The ferroelectric memory device according to claim 1, further comprising:
    a floating gate layer, disposed between the ferroelectric layer and the first blocking layer.

12. The ferroelectric memory device according to claim 11, further comprising:
    an additional floating gate layer, disposed at a side of the channel layer facing away from the second blocking layer, and located between the source/drain electrodes;
    an additional ferroelectric layer, disposed at a side of the additional floating gate layer facing away from the channel layer, and located between the source/drain electrodes; and
    an additional gate electrode, disposed at a side of the additional ferroelectric layer facing away from the additional floating gate layer, and located between the source/drain electrodes.

13. The ferroelectric memory device according to claim 12, further comprising:
    a sixth and a seventh blocking layers, sandwiched between the channel layer and the additional ferroelectric layer, and located between the source/drain electrodes, wherein the sixth and seventh blocking layers comprise a same material, and the seventh blocking layer is further incorporated with nitrogen.

14. The ferroelectric memory device according to claim 13, wherein the seventh blocking layer is disposed between the channel layer and the sixth blocking layer.

15. The ferroelectric memory device according to claim 1, wherein the source/drain electrodes are embedded in the channel layer.

16. A ferroelectric memory device, comprising:
a gate electrode;
a channel layer, disposed at a side of the gate electrode;
a ferroelectric layer, extending between the gate electrode and the channel layer;
a blocking layer, sandwiched between the ferroelectric layer and the channel layer, wherein the blocking layer and the channel layer comprise a same material and the blocking layer is further incorporated with nitrogen, or the blocking layer and the ferroelectric layer comprise a same material and the blocking layer is further incorporated with nitrogen; and
source/drain electrodes, disposed at opposite sides of the gate electrode, and electrically connected to the channel layer.

17. The ferroelectric memory device according to claim 16, wherein the blocking layer is in direct contact with the channel layer when the blocking layer and the channel layer comprise the same material, and is in direct contact with the ferroelectric layer when the blocking layer and the channel layer comprise the same material.

18. A semiconductor chip, comprising:
a semiconductor substrate;
active devices, formed on the semiconductor substrate;
interconnections, extending over the active devices and electrically connected to the active devices;
a memory array, disposed over the interconnections, and comprising ferroelectric memory devices respectively comprising:
a gate electrode;
a ferroelectric layer, disposed at a side of the gate electrode;
a channel layer, capacitively coupled to the gate electrode through the ferroelectric layer;
a first blocking layer and a second blocking layer, disposed between the ferroelectric layer and the channel layer, wherein the first and second blocking layers comprise a same material, and the second blocking layer is further incorporated with nitrogen; and
source/drain electrodes, disposed at opposite sides of the gate electrode, and electrically connected to the channel layer.

19. The semiconductor chip according to claim 18, wherein the ferroelectric memory devices are arranged at a same horizontal level.

20. The semiconductor chip according to claim 18, wherein the ferroelectric memory devices are arranged as multiple stacks.

* * * * *